US012598975B2

(12) United States Patent
Lee et al.

(10) Patent No.: US 12,598,975 B2
(45) Date of Patent: Apr. 7, 2026

(54) INTEGRATED CIRCUIT DEVICE

(71) Applicant: Samsung Electronics Co., Ltd.,
Suwon-si (KR)

(72) Inventors: Jina Lee, Suwon-si (KR); Jongdoo Kim, Suwon-si (KR); Bongkeun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 18/218,615

(22) Filed: Jul. 6, 2023

(65) Prior Publication Data

US 2024/0170370 A1      May 23, 2024

(30) Foreign Application Priority Data

Nov. 23, 2022      (KR) ........................ 10-2022-0158534

(51) Int. Cl.
| | |
|---|---|
| *H01L 23/48* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 84/85* | (2025.01) |

(52) U.S. Cl.
CPC ........... *H01L 23/481* (2013.01); *H10D 30/43* (2025.01); *H10D 30/6729* (2025.01); *H10D 30/6735* (2025.01); *H10D 30/6757* (2025.01); *H10D 62/121* (2025.01); *H10D 64/017* (2025.01); *H10D 84/85* (2025.01)

(58) Field of Classification Search
CPC ............ H01L 23/481; H01L 21/76895; H01L 23/5286; H01L 23/5226; H01L 23/5283; H10D 30/43; H10D 30/6729; H10D 30/6735; H10D 30/6757; H10D 62/121; H10D 64/017; H10D 84/85; H10D 84/83; H10D 84/0149; H10D 84/0186; H10D 84/038; H10D 62/118; H10D 84/853
See application file for complete search history.

(56) References Cited

U.S. PATENT DOCUMENTS

| | | | |
|---|---|---|---|
| 7,282,444 B2 | 10/2007 | Tanida et al. | |
| 10,403,619 B2 | 9/2019 | Qian et al. | |
| | | (Continued) | |

FOREIGN PATENT DOCUMENTS

| | | |
|---|---|---|
| JP | 2005-167093 A | 6/2005 |
| KR | 10-2022-0114917 A | 8/2022 |

*Primary Examiner* — Jonathan Han
(74) *Attorney, Agent, or Firm* — Muir Patent Law, PLLC

(57) ABSTRACT

An integrated circuit device includes a first cell and a second cell apart from each other in a first lateral direction on a substrate, the first cell and the second cell each including a plurality of gate lines, an inter-cell isolation region between the first cell and the second cell, the inter-cell isolation region extending in a second lateral direction, a power line including portions overlapping a cell boundary of each of the first cell and the second cell in a vertical direction and a portion overlapping the inter-cell isolation region in the vertical direction, a plurality of dummy gate insulation lines, a bridge insulating pattern in contact with an end portion of each of the plurality of dummy gate insulation lines, and a via power rail passing through the bridge insulating pattern, the via power rail being connected to the power line.

20 Claims, 29 Drawing Sheets

(56)                    References Cited

U.S. PATENT DOCUMENTS

| 10,553,438 | B2 | 2/2020 | Jang et al. |
| 11,037,950 | B2 | 6/2021 | Baek |
| 11,171,237 | B2 | 11/2021 | Shen et al. |
| 2021/0118798 | A1 | 4/2021 | Liebmann et al. |
| 2021/0376094 | A1* | 12/2021 | Lin ...................... H10D 84/038 |
| 2022/0058326 | A1 | 2/2022 | Lee et al. |
| 2022/0085057 | A1 | 3/2022 | Jang |
| 2022/0122970 | A1* | 4/2022 | Do .......................... H01L 23/50 |
| 2022/0223523 | A1* | 7/2022 | Lee ..................... H01L 23/5286 |
| 2022/0254690 | A1 | 8/2022 | Fulford et al. |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0158534, filed on Nov. 23, 2022, in the Korean Intellectual Property Office, the disclosure of which is incorporated by reference herein in its entirety.

BACKGROUND

The inventive concept relates to an integrated circuit (IC) device, and more particularly, to an IC device including a power line.

As electronic products are required to be miniaturized, multifunctional and highly efficient integrated circuit (IC) devices are also required to be larger in capacity and highly integrated. Accordingly, it is necessary to efficiently design wiring structures and isolation insulation structures to achieve high integration while securing the functions and operating speed required by IC devices.

SUMMARY

The inventive concept provides an integrated circuit (IC) device, which has a structure capable of preventing the occurrence of defects, such as undesired short circuits or disconnection between conductive lines, in a process of manufacturing the IC device, and has improved integration density and reliability.

According to an aspect of the inventive concept, there is provided an IC device including a first cell and a second cell apart from each other in a first lateral direction on a substrate, the first cell and the second cell each including a plurality of gate lines, an inter-cell isolation region between the first cell and the second cell, the inter-cell isolation region extending lengthwise in a second lateral direction, wherein the second lateral direction is perpendicular to the first lateral direction, a power line extending lengthwise in the first lateral direction on the substrate, the power line including portions overlapping a cell boundary of each of the first cell and the second cell in a vertical direction and a portion overlapping the inter-cell isolation region in the vertical direction, a plurality of dummy gate insulation lines extending lengthwise in the second lateral direction in the inter-cell isolation region, the plurality of dummy gate insulation lines being arranged at a constant pitch in the first lateral direction together with the plurality of gate lines, a bridge insulating pattern in contact with an end portion of each of the plurality of dummy gate insulation lines in the inter-cell isolation region, the bridge insulating pattern overlapping the power line in the vertical direction, and a via power rail passing through the bridge insulating pattern in the vertical direction, the via power rail being connected to the power line.

According to another aspect of the inventive concept, there is provided an IC device including a first cell region and a second cell region spaced apart from each other in a first lateral direction on a substrate, the first cell region and the second cell region each including a plurality of cells arranged in a line along a second lateral direction, wherein the second lateral direction is perpendicular to the first lateral direction, an inter-cell isolation region extending lengthwise in the second lateral direction between the first cell region and the second cell region, a plurality of power lines crossing the first cell region, the inter-cell isolation region, and the second cell region in the first lateral direction on a back side surface of the substrate, the plurality of power lines being parallel to each other, a plurality of dummy gate insulation lines on a front side surface of the substrate in the inter-cell isolation region, the plurality of dummy gate insulation lines intermittently extending in a straight line in the second lateral direction, a plurality of bridge insulating patterns respectively in contact with end portions of the plurality of dummy gate insulation lines in the inter-cell isolation region, the plurality of bridge insulating patterns overlapping the plurality of power lines in a vertical direction, and a plurality of via power rails in the inter-cell isolation region, wherein each of the plurality of via power rails passes through a bridge insulating pattern of a selected one of the plurality of bridge insulating patterns in the vertical direction and is connected to a selected one of the plurality of power lines.

According to another aspect of the inventive concept, there is provided an IC device including a first cell region and a second cell region spaced apart from each other in a first lateral direction on a substrate, the first cell region and the second cell region each including a plurality of cells, an inter-cell isolation region between the first cell region and the second cell region on the substrate, the inter-cell isolation region extending lengthwise in a second lateral direction, wherein the second lateral direction is perpendicular to the first lateral direction, a plurality of gate lines extending lengthwise in the second lateral direction in each of the plurality of cells, a plurality of dummy gate insulation lines extending lengthwise in the second lateral direction in the inter-cell isolation region, the plurality of dummy gate insulation lines arranged at a constant pitch in the first lateral direction together with the plurality of gate lines, a plurality of power lines on a back side surface of the substrate, each power line including a portion vertically overlapping a cell boundary of each of cells arranged in one row extending in the first lateral direction, from among the plurality of cells, a portion vertically overlapping a cell boundary of cells arranged in another row, which extends in the first lateral direction and is adjacent to the one row, from among the plurality of cells, and a portion vertically overlapping the inter-cell isolation region, a plurality of bridge insulating patterns in contact with end portions of at least two dummy gate insulation lines, which are selected from the plurality of dummy gate insulation lines and adjacent to each other in the first lateral direction in the inter-cell isolation region, the plurality of bridge insulation patterns having a width greater than a width of the plurality of dummy gate insulation lines in the first lateral direction, and the plurality of bridge insulating patterns overlapping the plurality of power lines in the vertical direction, a plurality of via power rails, each via power rail passing through a selected one of the plurality of bridge insulating patterns in a vertical direction in the inter-cell isolation region, each via power rail being connected to a selected one of the plurality of power lines, wherein a length of each of the plurality of dummy gate insulation lines is less than a length of at least one of the plurality of gate lines in the second lateral direction.

BRIEF DESCRIPTION OF THE DRAWINGS

Embodiments of the inventive concept will be more clearly understood from the following detailed description taken in conjunction with the accompanying drawings in which:

FIGS. 4A to 12B are cross-sectional views of a process sequence of a method of manufacturing an IC device, according to example embodiments, wherein FIGS. 4A, 5A, 6A, 7A, 8A, 9A, 10A, 11A, and 12A are enlarged cross-sectional views of some components in a portion corresponding to a cross-section taken along line X1-X1' of FIG. 1, according to a process sequence; FIGS. 4B, 5B, 6B, 7B, 8B, 9B, 10B, 11B, and 12B are enlarged cross-sectional views of some components in a portion corresponding to a cross-section taken along line X2-X2' of FIG. 1, according to a process sequence; FIGS. 5C, 8C, 9C, and 11C are plan views of a portion corresponding to FIG. 1, according to a process sequence;

DETAILED DESCRIPTION OF THE EMBODIMENTS

Figure 1:
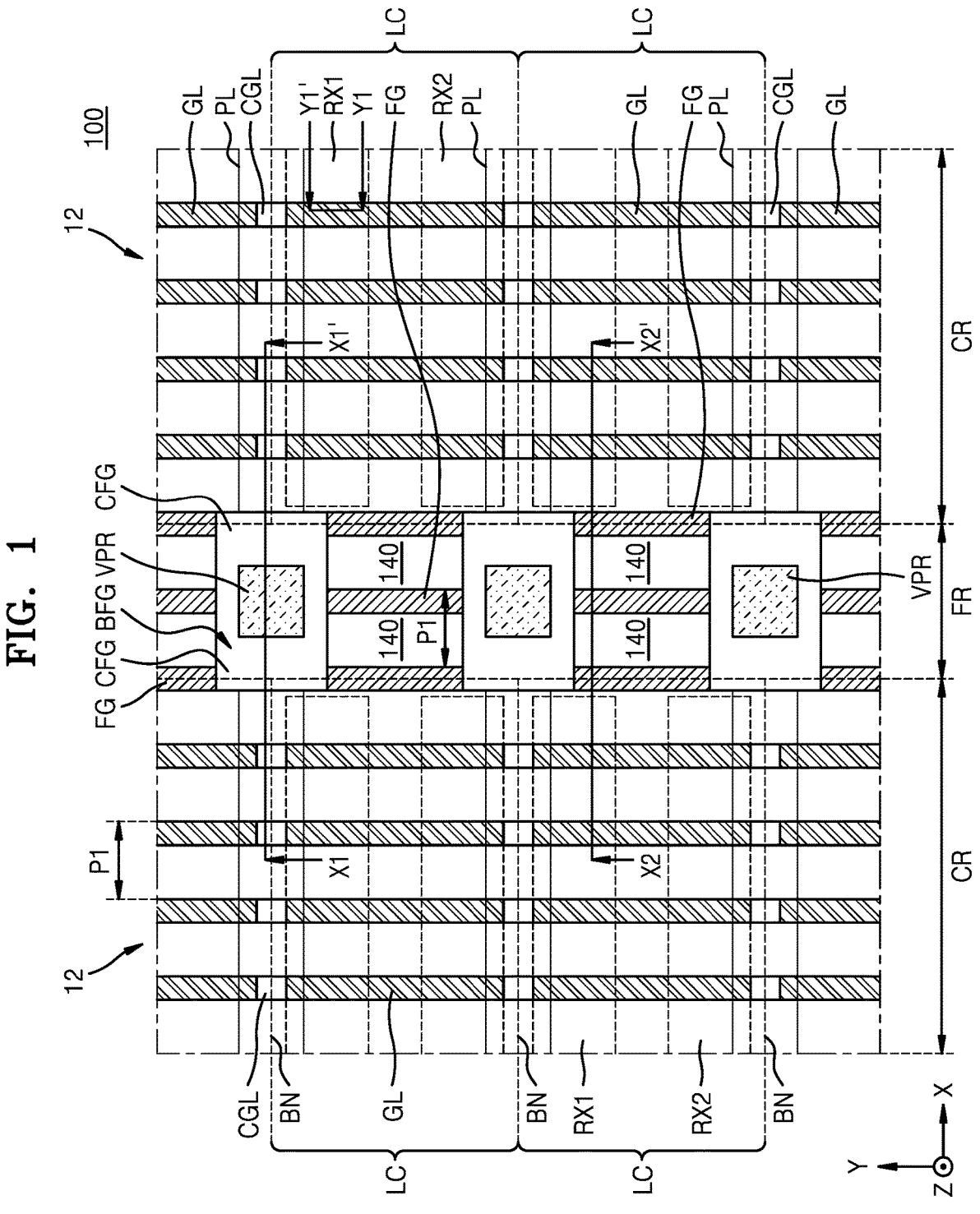
FIG. 1 is a plan layout diagram of a partial region of an integrated circuit (IC) device, according to example embodiments.

Hereinafter, embodiments will be described in detail with reference to the accompanying drawings. The same reference numerals are used to denote the same elements in the drawings, and repeated descriptions thereof are not repeated.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

FIG. 1 is a plan layout diagram of a partial region of an integrated circuit (IC) device 100, according to example embodiments.

Referring to FIG. 1, the IC device 100 may include a plurality of cell regions CR, which are spaced apart from each other in a first lateral direction (X direction). Each of the plurality of cell regions CR may include a plurality of cells LC, which are arranged in a line along a second lateral direction (Y direction). The second lateral direction (Y direction) may intersect with the first lateral direction (X direction). The second lateral direction (Y direction) may be a direction perpendicular to the first lateral direction (X direction). An inter-cell isolation region FR extending lengthwise in the second lateral direction (Y direction) may be between two cell regions CR, which are adjacent to each other in the first lateral direction (X direction) from among the plurality of cell regions CR. As used herein, a cell region CR located on one side of the inter-cell isolation region FR in the first lateral direction (X direction) may be referred to as a first cell region, and a cell region CR on the other side of the inter-cell isolation region FR in the first lateral direction (X direction) may be referred to as a second cell region.

In each of a plurality of cells LC included in the plurality of cell regions CR, a plurality of gate lines GL may extend lengthwise in the second lateral direction (Y direction). In the inter-cell isolation region FR, a plurality of dummy gate insulation lines FG may extend lengthwise in the second lateral direction (Y direction). The plurality of dummy gate insulation lines FG may be arranged at a constant pitch P1 in the first lateral direction (X direction) together with the plurality of gate lines GL included in each of the plurality of cells LC.

The cell region CR may include a cell block 12 including a plurality of cells LC. The cell block 12 may include a plurality of cells LC, which include circuit patterns configured to constitute various circuits. The plurality of cells LC may be arranged in a matrix form in the first lateral direction (X direction) and the second lateral direction (Y direction) in the cell block 12.

Each of the plurality of cells LC may include a circuit pattern having a layout designed according to a place-and-route (PnR) technique to perform at least one logic function. The plurality of cells LC may perform various logical functions. In embodiments, the plurality of cells LC may include a plurality of standard cells. In embodiments, at least some of the plurality of cells LC may perform the same logic function. In other embodiments, at least some of the plurality of cells LC may perform different logic functions.

The plurality of cells LC may include various kinds of logic cells including a plurality of circuit elements. For example, each of the plurality of cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the IC device 100, an area of each of the plurality of cells LC may be defined by a cell boundary BN. At least some of the plurality of cells LC arranged in one row extending in the first lateral direction (X direction) in the cell block 12 may have the same width as each other. At least some of the plurality of cells LC arranged in one row extending in the first lateral direction (X direction in the cell block 12 may have the same height as each other. However, the inventive concept is not limited thereto. For example, at least some of the plurality of cells LC arranged in one row extending in the first lateral direction (X direction) in the cell block 12 may have different widths and/or heights.

In embodiments, from among the plurality of cells LC arranged in one row extending in the first lateral direction (X direction), two adjacent cells LC may perform the same function as each other. In this case, the two adjacent cells LC may have the same structure as each other. In other embodiments, from among the plurality of cells LC arranged in one row extending in the first lateral direction (X direction), two adjacent cells LC may perform different functions from each other.

The IC device 100 may include a plurality of power lines PL. Each of the plurality of power lines PL may intersect with the plurality of cell regions CR and the inter-cell isolation region FR in the first lateral direction (X direction) and extend lengthwise in the first lateral direction (X direction). For example, each of the plurality of power lines PL may extend lengthwise in the first lateral direction (X direction) to overlap with the plurality of cell regions CR and the inter-cell isolation region FR. The plurality of power lines PL may be arranged parallel to each other. Each of the plurality of power lines PL may supply power to a plurality of cells LC, which are arranged in one row extending in the first lateral direction (X direction) in the plurality of cell regions CR.

Figure 2:
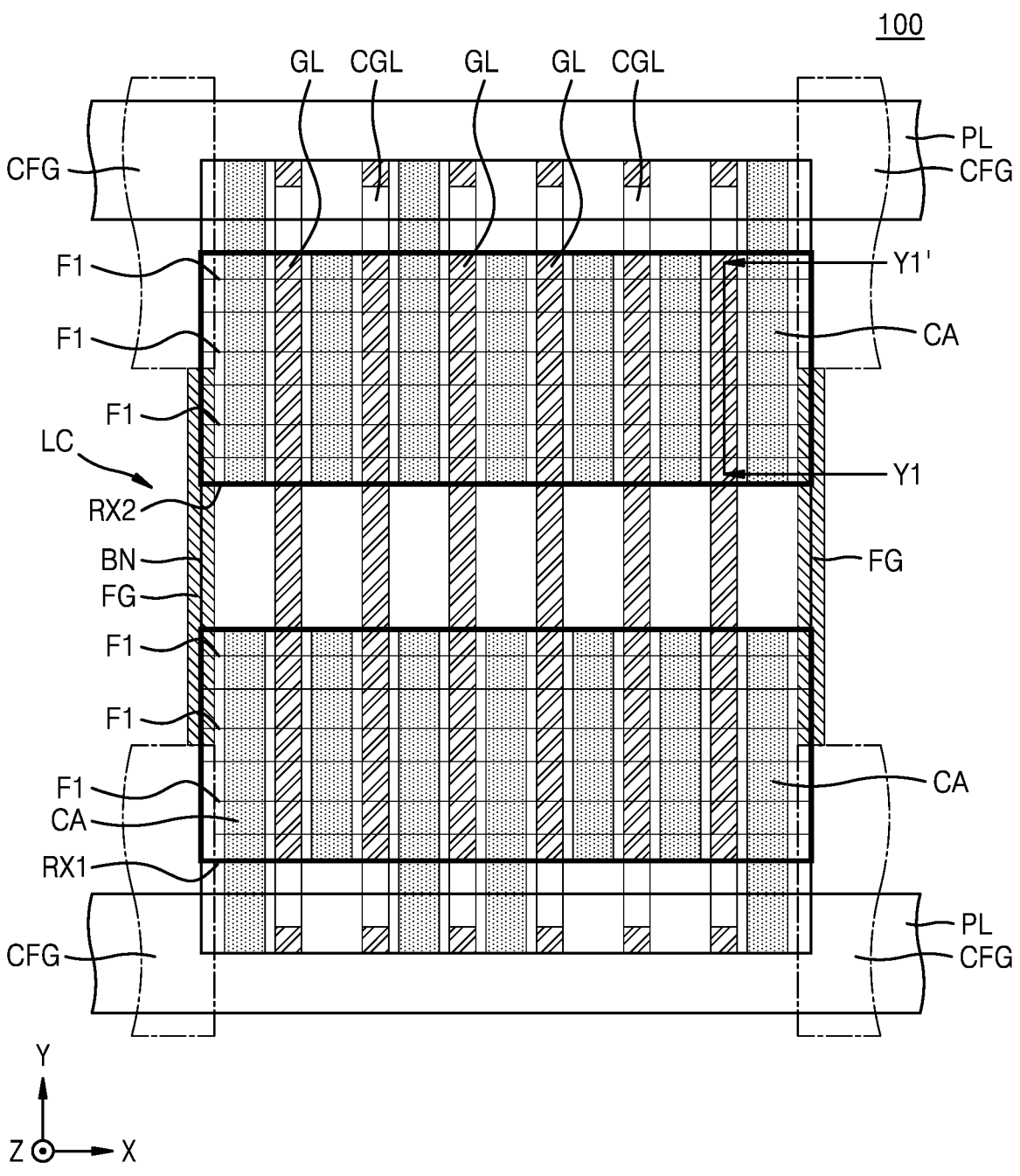
FIG. 2 is a plan layout diagram of an example configuration of a cell included in an IC device, according to example embodiments.
Figure 3A:
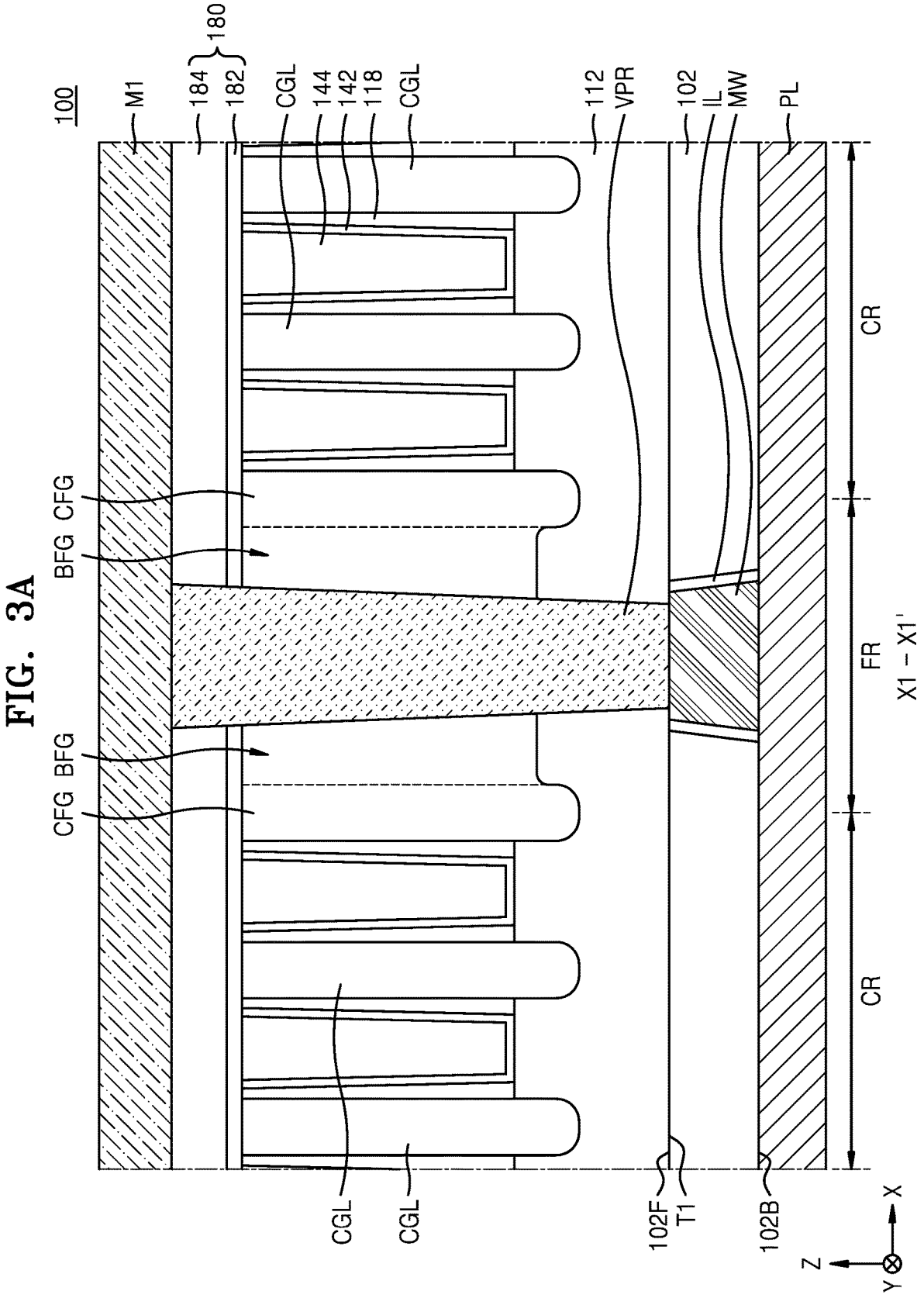
FIG. 3A is an enlarged cross-sectional view of a partial cross-sectional configuration taken along line X1-X1' of FIG. 1.
Figure 3B:
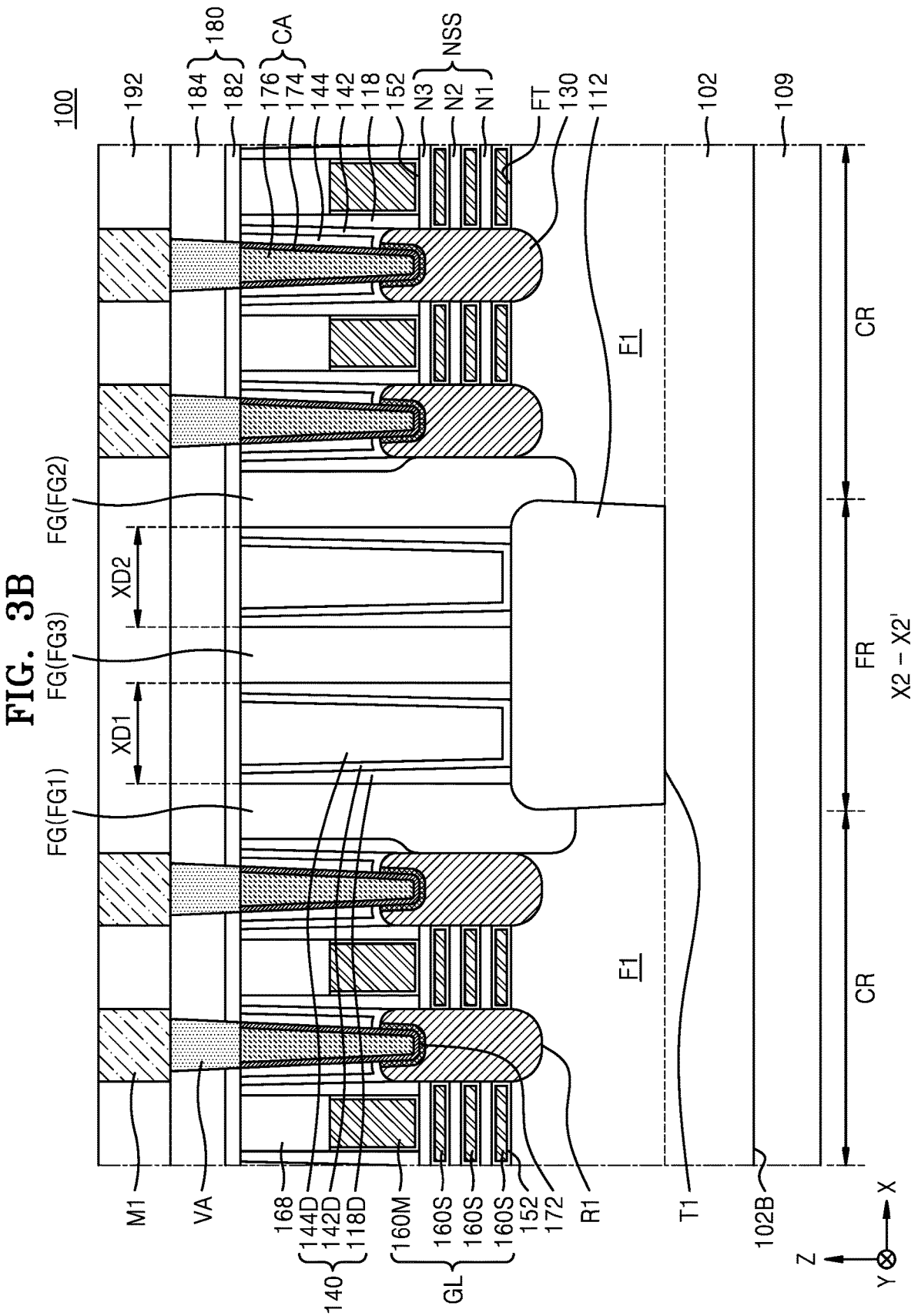
FIG. 3B is an enlarged cross-sectional view of a partial cross-sectional configuration taken along line X2-X2' of FIG. 1.
Figure 3C:
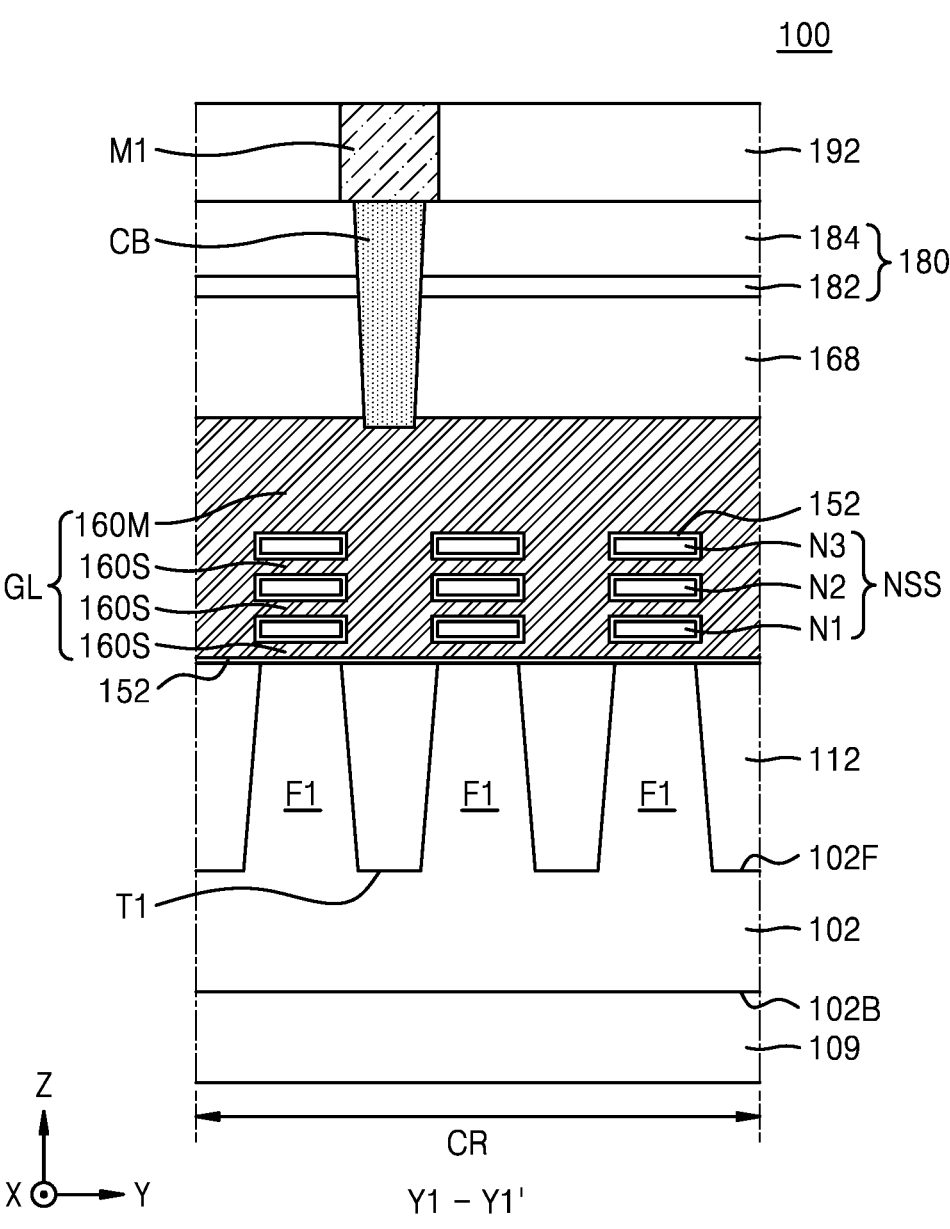
FIG. 3C is an enlarged cross-sectional view of a partial cross-sectional configuration taken along line Y1-Y1' of FIGS. 1 and 2.

FIG. 2 is a plan layout diagram of an example configuration of any one of the plurality of cells LC shown in FIG. 1. FIG. 3A is an enlarged cross-sectional view of a partial cross-sectional configuration taken along line X1-X1' of FIG. 1. FIG. 3B is an enlarged cross-sectional view of a partial cross-sectional configuration taken along line X2-X2' of FIG. 1. FIG. 3C is an enlarged cross-sectional view of a partial cross-sectional configuration taken along line Y1-Y1' of FIGS. 1 and 2. The IC device 100 including a field-effect transistor (FET) having a gate-all-around structure including an active region of a nanowire or nanosheet type and a gate surrounding the active region is described with reference to FIGS. 1, 2, and 3A to 3C.

Referring to FIGS. 1, 2, and 3A to 3C, the IC device 100 may include a plurality of cells LC, each of which has a planar area defined by a cell boundary BN on a substrate 102. The substrate 102 may include a front side surface 102F and a back side surface 102B, which are opposite to each other. The first lateral direction (X direction) and the second lateral direction (Y direction) may be parallel to the front side surface 102F of the substrate 102.

As shown in FIG. 2, the plurality of power lines PL may be on the back side surface 102B of the substrate 102. Each of the plurality of power lines PL may include a portion overlapping, in a vertical direction (Z direction), a cell boundary BN of each of a plurality of cells LC, which are selected from the plurality of cells LC and are in one row (or a first row) extending in a first lateral direction (X direction). Each of the plurality of power lines PL may include a portion overlapping, in the vertical direction (Z direction), a cell boundary BN of each of a plurality of cells LC, which are selected from the plurality of cells LC and are in another row (or a second row) that extends in the first lateral direction (X direction) and is adjacent to the first row. Each of the plurality of power lines PL may include a portion overlapping an inter-cell isolation region FR in the vertical direction (Z direction). The vertical direction (Z direction) may be perpendicular to the front side surface 102F of the substrate 102.

Each of the plurality of cells LC may include a first device region RX1 and a second device region RX2. A plurality of fin-type active regions F1 protruding in the vertical direction (Z direction) from the front side surface 102F of the substrate 102 may be in each of the first device region RX1 and the second device region RX2. The plurality of fin-type active regions F1 may extend lengthwise in the first lateral direction (X direction) and extend parallel to each other in the first device region RX1 and the second device region RX2 of the cell LC. In example embodiments, the plurality of fin-type active regions F1 may be part of the substrate 102 (e.g., formed by etching the substrate 102) or may be formed on the substrate 102 (e.g., an epitaxial layer grown from the substrate 102).

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure.

In the first device region RX1 and the second device region RX2 of each of the plurality of cells LC, a trench region T1 may be defined between the plurality of fin-type active regions F1, and the trench region T1 may be filled with a device isolation film 112. In the cell region CR, the device isolation film 112 may cover portions of both sidewalls of each of the plurality of fin-type active regions F1 in a second lateral direction (Y direction). For example, in the cell region CR, the device isolation film 112 may contact both sidewalls of each of the plurality of fin-type active regions F1. The device isolation film 112 may include a silicon oxide film, without being limited thereto. In the first device region RX1 and the second device region RX2, each of the plurality of fin-type active regions F1 may protrude as a fin type above the device isolation film 112.

As shown in FIGS. 3A and 3B, the device isolation film 112 may cover the front side surface 102F of the substrate 102 in the cell region CR and the inter-cell isolation region FR. For example, the device isolation film 112 may contact the front side surface 102F of the substrate 102. As shown in FIG. 3B, a portion of the device isolation film 112, which is in the inter-cell isolation region FR, may cover both sidewalls of each of the plurality of fin-type active regions F1 in the first lateral direction (X direction). For example, in the inter-cell isolation region FR, the device isolation film 112 may contact both sidewalls of each of the plurality of fin-type active regions F1.

In the first device region RX1 and the second device region RX2 of each of the plurality of cells LC, the plurality of gate lines GL may extend lengthwise in the second lateral direction (Y direction), which is a direction crossing the plurality of fin-type active regions F1. The front side surface 102F of the substrate 102 may face the plurality of gate lines GL.

In embodiments, the first device region RX1 may be an NMOS transistor region, and a plurality of NMOS transistors may be formed in portions where the fin-type active regions F1 intersect with the gate lines GL in the first device region RX1. The second device region RX2 may be a PMOS transistor region, and a plurality of PMOS transistors may be formed in portions where the fin-type active regions F1 intersect with the gate lines GL in the second device region RX2.

As shown in FIGS. 3B and 3C, a plurality of nanosheet stacks NSS may be on respective fin top surfaces FT of the plurality of fin-type active regions F1 in regions where the plurality of fin-type active regions F1 intersect with the plurality of gate lines GL. Each of the plurality of nanosheet stacks NSS may include at least one nanosheet, which is spaced apart from the fin top surface FT of the fin-type active region F1 in the vertical direction (Z direction) and faces the fin top surface FT of the fin-type active region F1. As used herein, the term "nanosheet" refers to a conductive structure having a cross-section that is substantially perpendicular to a direction in which current flows. The nanosheet may be interpreted as including a nanowire.

Each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-directional distances) from the fin top surface FT of the fin-type active region F1. Each of the plurality of gate lines GL may surround the first to third nanosheets N1, N2, and N3 included in the nanosheet stack NSS.

The present embodiment pertains to a configuration in which the plurality of nanosheet stacks NSS and the plurality of gate lines GL are formed on one fin-type active region F1, and the plurality of nanosheet stacks NSS are arranged in a line along the first lateral direction (X direction) on one fin-type active region F1. However, the number of nanosheet stacks NSS and the number of gate lines GL on one fin-type active region F1 are not specifically limited.

Each of the first to third nanosheets N1, N2, and N3 included in the nanosheet stack NSS may function as a channel region. In embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction). In embodiments, each of the first to third nanosheets N1, N2, and N3 included in the nanosheet stack NSS may include a Si layer, a SiGe layer, or a combination thereof.

As shown in FIG. 3B, the first to third nanosheets N1, N2, and N3 included in one nanosheet stack NSS may have the same length in the first lateral direction (X direction). In other embodiments, differently from that shown in FIG. 3B, at least some of the first to third nanosheets N1, N2, and N3 included in one nanosheet stack NSS may have different lengths in the first lateral direction (X direction). The present embodiment pertains to an example in which each of the plurality of nanosheet stacks NSS includes three nanosheets, but the inventive concept is not limited thereto. For example, the nanosheet stack NSS may include at least one nanosheet, and the number of nanosheets in the nanosheet stack NSS is not specifically limited.

As shown in FIGS. 3B and 3C, each of the plurality of gate lines GL may include a main gate portion 160M and a plurality of sub-gate portions 160S. The main gate portion 160M may cover a top surface of the nanosheet stack NSS and extend lengthwise in the second lateral direction (Y direction). The plurality of sub-gate portions 160S may be integrally connected to the main gate portion 160M and respectively arranged between the first to third nanosheets N1, N2, and N3 and between the first nanosheet N1 and the fin-type active region F1. In the vertical direction (Z direction), a thickness of each of the plurality of sub-gate portions 160S may be less than a thickness of the main gate portion 160M.

As shown in FIG. 3B, a plurality of recesses R1 may be formed in the fin-type active region F1. A lowermost surface of each of the plurality of recesses R1 may be at a lower vertical level than the fin top surface FT of the fin-type active region F1. A plurality of source/drain regions 130 may be provided in the plurality of recesses R1. Each of the plurality of source/drain regions 130 may be adjacent to at least one gate line GL selected from the plurality of gate lines GL. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the plurality of source/drain regions 130 may include a semiconductor epitaxial layer, which is epitaxially grown from a surface of the fin-type active region F1 exposed in the plurality of recesses R1 and a surface of each of the first to third nanosheets N1, N2, and N3. In embodiments, the plurality of source/drain regions 130 may include an epitaxially grown Si layer, an epitaxially grown SiC layer, or a plurality of epitaxially grown SiGe layers. When the first device region RX1 is an NMOS transistor region and the second device region RX2 is a PMOS transistor region, the plurality of source/drain regions 130 in the first device region RX1 may include a Si layer doped with an n-type dopant or a SiC layer doped with an n-type dopant, and the plurality of source/drain regions 130 in the second device region RX2 may include a SiGe layer doped with a p-type dopant. The n-type dopant may be selected from phosphorus (P), arsenic (As), and antimony (Sb). The p-type dopant may be selected from boron (B) and gallium (Ga).

In embodiments, the plurality of source/drain regions 130 in the first device region RX1 may have different shapes and sizes from the plurality of source/drain regions 130 in the second device region RX2. A shape of each of the plurality of source/drain regions 130 is not limited to that shown in FIG. 3B, and the plurality of source/drain regions 130 having various shapes and sizes may be formed in the first device region RX1 and the second device region RX2.

Each of the gate lines GL may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). In embodiments, each of the plurality of gate lines GL may include a TiN film, a stack structure of TiAlC/TiN, a stack structure of TiAlC/TiN/W, a stack structure of TiN/TaN/TiAlC/TiN/W, or a stack structure of TiN/TaN/TiN/TiAlC/TiN/W, without being limited thereto.

A gate dielectric film 152 may be between the nanosheet stack NSS and the gate line GL. In embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIGS. 3B and 3C, a top surface of each of the gate dielectric film 152 and the gate line GL may be covered by a capping insulating pattern 168. The capping insulating pattern 168 may include a silicon nitride film.

Both sidewalls of each of the gate line GL and the capping insulating pattern 168 may be covered by insulating spacers 118. The insulating spacers 118 may cover both sidewalls of the main gate portion 160M on the top surfaces of the plurality of nanosheet stacks NSS. The insulating spacers 118 may be spaced apart from the gate line GL with the gate dielectric film 152 therebetween. The insulating spacer 118 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A metal silicide film 172 may be on a top surface of each of the plurality of source/drain regions 130. The metal silicide film 172 may be formed of a metal, which includes titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). For example, the metal silicide film 172 may include titanium silicide, without being limited thereto.

The plurality of source/drain regions 130, a plurality of metal silicide films 172, and a plurality of insulating spacers 118 may be covered by an insulation liner 142 on the substrate 102. In embodiments, the insulation liner 142 may be omitted. For example, the insulation liner 142 may contact the plurality of source/drain regions 130, the plurality of metal silicide films 172, and the plurality of insulating spacers 118. An inter-gate insulating film 144 may be on the insulation liner 142. When the insulation liner 142 is omitted, the inter-gate insulating film 144 may be in contact with the plurality of source/drain regions 130. In the plurality of cells LC, the insulating spacers 118, the insulation liner 142, and the inter-gate insulating film 144 may constitute an inter-gate insulation structure.

In embodiments, the insulation liner 142 may be formed of silicon nitride, SiCN, SiBN, SiON, SiOCN, SiBCN, or a combination thereof, without being limited thereto. The inter-gate insulating film 144 may be formed of a silicon oxide film, without being limited thereto.

Both sidewalls of each of the plurality of sub-gate portions 160S included in the plurality of gate lines GL may be spaced apart from the source/drain region 130 with the gate dielectric film 152 therebetween. The gate dielectric film 152 may be between the sub-gate portions 160S included in the gate line GL and each of the first to third nanosheets N1, N2, and N3 and between the sub-gate portions 160S included in the gate line GL and the source/drain region 130.

The plurality of nanosheet stacks NSS may be respectively on the fin top surfaces FT of the plurality of fin-type active regions F1 in regions where the plurality of fin-type active regions F1 intersect with (e.g., cross) the plurality of gate lines GL. Each of the plurality of nanosheet stacks NSS may be spaced apart from the fin-type active region F1 and face the fin top surface FT of the fin-type active region F1. On the substrate 102, a plurality of nanosheet transistors may be formed in portions where the plurality of fin-type active regions F1 intersect with (e.g., cross) the plurality of gate lines GL.

As shown in FIGS. 1 and 3A, in the cell block 12, a plurality of gate cut insulating patterns CGL may be in the cell boundary BN of each of the plurality of cells LC, which extends in the first lateral direction (X direction). Each of the plurality of gate cut insulating patterns CGL may be in an extension line of a corresponding one of the plurality of gate lines GL. For example, each of the plurality of gate cut insulating patterns CGL may overlap a line extending from a corresponding one of the plurality of gate lines GL in the second lateral direction (Y direction). In the cell block 12, the plurality of gate cut insulating patterns CGL may extend in the second lateral direction (Y direction) across the cell boundary BN of each of a pair of cells LC, which are adjacent to each other in the second lateral direction (Y direction). The plurality of gate cut insulating patterns CGL may be in a line along a straight line in the first lateral direction (X direction) between the pair of cells LC. In embodiments, the plurality of gate cut insulating patterns CGL may include a silicon nitride film, without being limited thereto.

As shown in FIGS. 1, 2, and 3B, in the inter-cell isolation region FR, the plurality of dummy gate insulation lines FG may extend lengthwise in the second lateral direction (Y direction) on the front side surface 102F of the substrate 102. From among the plurality of dummy gate insulation lines FG arranged in the inter-cell isolation region FR, a plurality of dummy gate insulation lines FG that are between a pair of cells LC, which are spaced apart from each other in the first lateral direction (X direction) with the inter-cell isolation region FR therebetween, may be arranged at a constant pitch P1 in the first lateral direction (X direction) together with the plurality of gate lines GL included in the plurality of cells LC. In the second lateral direction (Y direction), a length of each of the plurality of dummy gate insulation lines FG may be less than a length of at least one of the plurality of gate lines GL included in the plurality of cells LC.

Each of the plurality of dummy gate insulation lines FG may not include a portion overlapping the power line PL in the vertical direction (Z direction). From among the plurality of dummy gate insulation lines FG, a plurality of dummy gate insulating lines FG arranged in one straight line in the second lateral direction (Y direction) may be intermittently extend in the second lateral direction (Y direction).

As shown in FIGS. 1 and 3B, three dummy gate insulation lines FG may be between a pair of cells LC, which are spaced apart from each other in the first lateral direction (X direction) with the inter-cell isolation region FR therebetween. The three dummy gate insulation lines FG may include first to third dummy gate insulation lines FG1, FG2, and FG3. The first dummy gate insulation line FG1 may overlap the cell boundary BN of a selected one of the pair of cells LC in the vertical direction (Z direction). The second dummy gate insulation line FG2 may overlap another one of the pair of cells LC in the vertical direction (Z direction). The third dummy gate insulation line FG3 may be between the first dummy gate insulation line FG1 and the second dummy gate insulation line FG2. In the first lateral direction (X direction), a distance XD1 between the first dummy gate insulation line FG1 and the third dummy gate insulation line FG3 may be substantially equal to a distance XD2 between the second dummy gate insulation line FG2 and the third dummy gate insulation line FG3.

As shown in FIG. 3B, each of the first dummy gate insulation line FG1 and the second dummy gate insulation line FG2 may include a portion overlapping the fin-type active region F1 in the vertical direction (Z direction). A lowermost surface of each of the first dummy gate insulation line FG1 and the second dummy gate insulation line FG2, which is closest to the substrate 102, may be closer to the substrate 102 than the fin top surface FT of the fin-type active region F1. Each of the first dummy gate insulation line FG1 and the second dummy gate insulation line FG2 may include a portion in contact with the device isolation film 112. Of the third dummy gate insulation line FG3 between the first dummy gate insulation line FG1 and the second dummy gate insulation line FG2, a lowermost surface that is closest to the substrate 102 may be in contact with a top surface of the device isolation film 112. In the inter-cell isolation region FR, the device isolation film 112 may include a portion between the substrate 102 and the plurality of dummy gate insulation lines FG.

As shown in FIG. 1, each of the plurality of dummy gate insulation lines FG that are between the pair of cells LC, which are spaced apart from each other in the first lateral direction (X direction) with the inter-cell isolation region FR therebetween, may have a length less than a length of at least one of the plurality of gate lines GL included in the pair of cells LC in the second lateral direction (Y direction). In embodiments, the plurality of dummy gate insulation lines FG between the pair of cells LC, which are spaced apart from each other in the first lateral direction (X direction), may substantially have the same length in the second lateral direction (Y direction). In other embodiments, at least some of the plurality of dummy gate insulation lines FG between the pair of cells LC, which are spaced apart from each other in the first lateral direction (X direction), may have different lengths in the second lateral direction (Y direction).

The present embodiment pertains to a case in which three dummy gate insulation lines FG are between the pair of cells LC, which are spaced apart from each other in the first lateral direction (X direction) with the inter-cell isolation region FR therebetween, but the inventive concept is not limited thereto. For example, one, two, or at least four dummy gate insulation lines FG may be between the pair of cells LC, which are spaced apart from each other in the first lateral direction (X direction) with the inter-cell isolation region FR therebetween.

As shown in FIGS. 1 and 3A, a plurality of bridge insulating patterns BFG may be in the inter-cell isolation region FR. The plurality of bridge insulating patterns BFG may be spaced apart from each other in the second lateral direction (Y direction) and be arranged in a line along the second lateral direction (Y direction). In the first lateral direction (X direction), a width of the bridge insulating pattern BFG may be greater than a width of each of the plurality of dummy gate insulation lines FG. In example embodiments, the bridge insulating pattern BFG may extend from an outside surface of the first dummy gate insulation line FG1 to an outside surface of the second dummy gate insulation line FG2. For example, the bridge insulating pattern BFG may extend from a vertical surface of the first dummy gate insulation line FG1 overlapping the cell region CR at a first side of the inter-cell isolation region FR to a vertical surface of the second dummy gate insulation line FG2 overlapping the cell region CR at a second side of the inter-cell isolation region FR.

As shown in FIG. 1, each of the plurality of bridge insulating patterns BFG may be in an extension line of the cell boundary BN of a corresponding one of the plurality of cells LC in the first lateral direction (X direction). For example, each bridge insulating pattern BFG may overlap a line extending from the cell boundary BN of a corresponding one of the plurality of cells LC in the first lateral direction (X direction). As shown in FIGS. 1 and 3A, each of the plurality of bridge insulating patterns BFG may be at a position overlapping one power line PL in a vertical direction.

At least one dummy gate insulation line FG may be between every two adjacent ones of the plurality of bridge insulating patterns BFG. FIG. 1 illustrates a configuration in which three dummy gate insulation lines FG are between every two adjacent ones of the plurality of bridge insulating patterns BFG. Each of the plurality of bridge insulating patterns BFG may be in contact with an end of one of the plurality of dummy gate insulation lines FG, which is adjacent thereto.

As shown in FIGS. 1, 2, and 3A, each of the plurality of bridge insulating patterns BFG may include a bridge insulating edge portion CFG, which is in the extension line of the cell boundary BN of the cell LC in the second lateral direction (Y direction). For example, each bridge insulating edge portion CFG may overlap a line extending from the cell boundary BN of the cell LC in the second lateral direction (Y direction). The bridge insulating edge portion CFG of the bridge insulating pattern BFG may be in contact with at least one dummy gate insulation line FG. For example, the bridge insulating edge portion CFG of the bridge insulating pattern BFG may be in contact with at least one of the first dummy gate insulation line FG1 and the second dummy gate insulation line FG2, which overlap, in the vertical direction (Z direction), the cell boundary BN of the cell LC in the second lateral direction (Y direction). The bridge insulating edge portion CFG may extend in a straight line in the second lateral direction (Y direction) along with the first dummy gate insulation line FG1 or the second dummy gate insulation line FG2.

A portion of the bridge insulating pattern BFG, which is spaced apart from the cell LC in the first lateral direction (X direction), may be in contact with the third dummy gate insulation line FG3. In other embodiments, differently from that shown in FIG. 1, the bridge insulating pattern BFG may not be in contact with at least one of the first to third dummy gate insulation lines FG1, FG2, and FG3, and another insulating film may be between the bridge insulating pattern BFG and at least one of the first to third dummy gate insulation lines FG1, FG2, and FG3.

As shown in FIG. 3A, a bottom surface of the bridge insulating pattern BFG, which faces the substrate 102, may be in contact with the device isolation film 112. In the inter-cell isolation region FR, the device isolation film 112 may include a portion between the substrate 102 and the plurality of bridge insulating patterns BFG. In embodiments, the plurality of dummy gate insulation lines FG and the plurality of bridge insulating patterns BFG may each include a silicon nitride film, without being limited thereto.

As shown in FIG. 1, a width of the bridge insulating pattern BFG in the second lateral direction (Y direction) may be greater than a width of the power line PL in the second lateral direction (Y direction). In other embodiments, differently from that shown in FIG. 1, the bridge insulating pattern BFG may have a portion of which a width is equal to or less than the width of the power line PL in the second lateral direction (Y direction). Although FIG. 1 illustrates a case in which the bridge insulating pattern BFG has a substantially rectangular planar shape, the inventive concept is not limited thereto. For example, a planar shape of the bridge insulating pattern BFG may have various shapes, such as an elliptical shape, a rhombus shape, and an irregular polygonal shape.

As shown in FIG. 3B, in the inter-cell isolation region FR, a source/drain via contact 140 may be between the plurality of dummy gate insulation lines FG. For example, the source/drain via contact 140 may be between each adjacent pair of the plurality of dummy gate insulation lines FG. The source/drain via contact 140 may include a dummy insulating spacer 118D, a dummy insulation liner 142D, and a dummy inter-gate insulating film 144D. Details of the dummy insulating spacer 118D, the dummy insulation liner 142D, and the dummy inter-gate insulating film 144D may be substantially the same as those of the insulating spacer 118, the insulation liner 142, and the inter-gate insulating film 144, which are in the cell LC. The dummy insulating spacer 118D, the dummy insulation liner 142D, and the dummy inter-gate insulating film 144D may respectively be formed of the same materials as the insulating spacer 118, the insulation liner 142, and the inter-gate insulating film 144, which are in the cell LC. For example, the insulating spacer 118 and the dummy insulating spacer 118D may include the same material as each other, the insulation liner 142 and the dummy insulation liner 142D may include the same material as each other, and the inter-gate insulating film 144 and the dummy inter-gate insulating film 144D may include the same material as each other. The source/drain via contact 140 may include a portion in contact with the bridge insulating pattern BFG.

As shown in FIG. 3B, the device isolation film 112 may include a portion between the source/drain via contact 140 and the substrate 102 in the inter-cell isolation region FR. In the inter-cell isolation region FR, the source/drain via contact 140 may be in contact with the top surface of the device isolation film 112.

As shown in FIGS. 1 and 3A, a plurality of via power rails VPR may be in the inter-cell isolation region FR. Each of the plurality of via power rails VPR may be in an extension line of the cell boundary BN of a corresponding one of the plurality of cells LC in the first lateral direction (X direction) in the inter-cell isolation region FR. For example, each of the plurality of via power rails VPR may overlap a line extending from the cell boundary BN of a corresponding one of the plurality of cells LC in the first lateral direction (X direction). In example embodiments, a center of each of the plurality of via power rails VPR may aligned in the first lateral direction (X direction) with the cell boundary BN of a corresponding one of the plurality of cells LC.

As shown in FIG. 1, the plurality of via power rails VPR may be spaced apart from each other in the second lateral direction (Y direction) and be arranged in a line along a straight line in the second lateral direction (Y direction). For example, the plurality of via power rails VPR may be aligned with one other in the second lateral direction (Y direction). However, the inventive concept is not limited thereto. For example, some of the plurality of via power rails VPR may be in a straight line that extends in the second lateral direction (Y direction), and some others of the plurality of via power rails VPR may extend in the second lateral direction (Y direction) and be in a zigzag manner in a second straight line, which is spaced apart from the first straight line in the first lateral direction (X direction).

As shown in FIG. 3A, in the inter-cell isolation region FR, each of the plurality of via power rails VPR may pass through a selected one of the plurality of bridge insulating patterns BFG in the vertical direction (Z direction), pass through the device isolation film 112 in the vertical direction (Z direction), and be connected to a selected one of the plurality of power lines PL. For example, a middle portion of each of the plurality of via power rails VPR may be surrounded by a corresponding one of the plurality of bridge insulating patterns BFG, and a lower portion of each of the plurality of via power rails VPR may be surrounded by the device isolation film 112. A vertical level of a top surface of each of the plurality of via power rails VPR, which is farthest from the substrate 102, may be farther from the substrate 102 than a vertical level of a top surface of the bridge insulating pattern BFG, which is farthest from the substrate 102. For example, the top surfaces of the via power rails VPR may be at a higher vertical level than top surfaces of the bridge insulating patterns BFG.

In embodiments, each of the plurality of via power rails VPR may include a metal plug and a conductive barrier film surrounding the metal plug. The metal plug may include molybdenum (Mo), cobalt (Co), copper (Cu), tungsten (W), ruthenium (Ru), manganese (Mn), titanium (Ti), tantalum (Ta), aluminum (Al), a combination thereof, or an alloy thereof. The conductive barrier film may include titanium (Ti), titanium nitride (TiN), tantalum (Ta), tantalum (TaN), or a combination thereof. In embodiments, sidewalls of each of the plurality of via power rails VPR may be surrounded by via insulating spacers. The via insulating spacers may include a silicon oxide film, a silicon oxynitride film, a silicon nitride film, or a combination thereof.

As shown in FIG. 3B, a plurality of source/drain contacts CA may be on the plurality of source/drain regions 130. Each of the plurality of source/drain contacts CA may pass through the inter-gate insulating film 144 and the insulation liner 142 in the vertical direction (Z direction) and may be in contact with the metal silicide film 172. Each of the plurality of source/drain contacts CA may be electrically connectable to the source/drain region 130 through the metal silicide film 172. Each of the plurality of source/drain contacts CA may be spaced apart from the main gate portion 160M with the insulating spacer 118 therebetween in the first lateral direction (X direction).

Each of the plurality of source/drain contacts CA may include a conductive barrier film 174 and a contact plug 176, which are sequentially stacked on the source/drain region 130. The conductive barrier film 174 may surround and contact a bottom surface and a sidewall of the contact plug 176. Each of the plurality of source/drain contacts CA may include a portion, which is surrounded by the inter-gate insulating film 144 and extends lengthwise in the vertical direction (Z direction). The conductive barrier film 174 may be between the metal silicide film 172 and the contact plug 176. The conductive barrier film 174 may have a surface in contact with the metal silicide film 172 and a surface in contact with the contact plug 176. In embodiments, the conductive barrier film 174 may include a metal or a metal nitride. For example, the conductive barrier film 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

As shown in FIGS. 3B and 3C, a top surface of each of the plurality of source/drain contacts CA, a plurality of capping insulating patterns 168, and the inter-gate insulating film 144 may be covered by an upper insulation structure 180. The upper insulation structure 180 may include an etch stop film 182 and an upper insulating film 184, which are sequentially stacked on the top surface of each of the plurality of source/drain contacts CA, the plurality of capping insulating patterns 168, and the inter-gate insulating film 144. A bottom surface of the etch stop film 182 may contact upper surfaces of the plurality of source/drain contacts CA, the plurality of capping insulating patterns 168, and the inter-gate insulating film 144. The etch stop film 182 may be formed of silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The upper insulating film 184 may be formed of an oxide film, a nitride film, an ultralow-k (ULK) film having an ultralow dielectric constant K of about 2.2 to about 2.4, or a combination thereof. For example, the upper insulating film 184 may be formed of a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIG. 3B, a plurality of source/drain via contacts VA may be on the plurality of source/drain contacts CA. Each of the plurality of source/drain via contacts VA may pass through the upper insulating structure 180 and may be in contact with the source/drain contact CA. Each of the plurality of source/drain regions 130 may be electrically connected to the source/drain via contact VA through the metal silicide film 172 and the source/drain contact CA. A bottom surface of each of the plurality of source/drain via contacts VA may be in contact with a top surface of the source/drain contact CA. Each of the plurality of source/drain via contacts VA may include a metal film and a conductive barrier film surrounding the metal film. The metal film may include molybdenum (Mo), copper (Co), copper (Cu), tungsten (W), ruthenium (Ru), manganese (Mn), or a combination thereof. The conductive barrier film may include Ti, Ta, W, TiN, TaN, WN, WCN, TiSiN, TaSiN, WSiN, or a combination thereof, without being limited thereto. The conductive barrier film may be omitted in each of the plurality of source/drain via contacts VA.

As shown in FIG. 3C, a gate contact CB may be on the gate line GL. The gate contact CB may pass through the upper insulation structure 180 and the capping insulating pattern 168 in the vertical direction (Z direction) and be connected to the gate line GL. A bottom surface of the gate contact CB may be in contact with a top surface of the gate line GL. The gate contact CB may include a metal film and a conductive barrier film surrounding the metal film. The metal film may include Mo, Co, Cu, W, Ru, Mn, or a combination thereof. The conductive barrier film may include Ti, Ta, W, TiN, TaN, WN, WCN, TiSiN, TaSiN, WSiN, or a combination thereof, without being limited thereto. The conductive barrier film may be omitted in the gate contact CB.

As shown in FIG. 3A, a via power rail VPR may pass through the upper insulation structure 180 in the vertical direction (Z direction). A top surface of the via power rail VPR may be coplanar with a top surface of the upper insulation structure 180. Each of the plurality of source/drain contacts CA, the plurality of source/drain via contacts VA, and the gate contact CB may be spaced apart from the plurality of via power rails VPR in a lateral direction. Each of the plurality of source/drain contacts CA, the plurality of source/drain via contacts VA, and the gate contact CB may not include a portion overlapping the plurality of power lines PL in the vertical direction (Z direction).

As shown in FIGS. 3B and 3C, an interlayer insulating film 192 may be on each of the upper insulation structure 180, the plurality of source/drain via contacts VA, the gate contact CB, and the plurality of via power rails VPR. A constituent material of the interlayer insulating film 192 may be substantially the same as that of the upper insulating film 184, which has been described above.

A plurality of upper wiring layers M1 may pass through the interlayer insulating film 192. Each of the plurality of upper wiring layers M1 may be connected to a selected one of the plurality of source/drain via contacts VA, the plurality of gate contacts CB, and the plurality of via power rails VPR, which are located thereunder. For example, each of the plurality of upper wiring layers M1 may contact a selected one of the plurality of source/drain via contacts VA, the plurality of gate contacts CB, and the plurality of via power rails VPR. Each of the plurality of via power rails VPR may be connected to the source/drain via contact VA through at least one upper wiring layer M1 selected from the plurality of upper wiring layers M1. The plurality of upper wiring layers M1 may include Mo, Co, Cu, W, Ru, Mn, Ti, Ta, Al, a combination thereof, or an alloy thereof, without being limited thereto.

A selected one of the plurality of source/drain via contacts VA may be spaced apart from the via power rail VPR in a lateral direction and may be connected between the source/drain contact CA and the upper wiring layer M1. From among the plurality of source/drain regions 130, the source/drain region 130 connected to the via power rail VPR may be electrically connected to the via power rail VPR through the source/drain contact CA, the source/drain via contact VA, and the upper wiring layer M1.

As shown in FIG. 3A, a back side power rail MW may pass through the substrate 102 in the vertical direction (Z direction) from the back side surface 102B of the substrate 102. The back side power rail MW may be between the via power rail VPR and the power line PL and may include a portion in contact with the via power rail VPR and a portion in contact with the power line PL. A top surface of the back side power rail MW may be coplanar with the front side surface 102F of the substrate 102, and a bottom surface of the back side power rail MW may be coplanar with the back side surface 102B of the substrate 102. The back side power rail MW may have a shape that widens from the front side to the back side surface 102B of the substrate 102. For example, sidewalls of the back side power rail MW may be sloped. In embodiments, the back side power rail MW may include a metal plug and a conductive barrier film surrounding the metal plug. The metal plug may include Mo, Co, Cu, W, Ru, Mn, Ti, Ta, Al, a combination thereof, or an alloy thereof. The conductive barrier film may include Ti, TiN, Ta, TaN, or a combination thereof. Sidewalls of the back side power rail MW may be surrounded by insulating spacers IL. The insulating spacers IL may contact sidewalls of the back side power rail MW. The back side power rail MW may be spaced apart from the substrate 102 with the insulating spacers IL therebetween. The back side insulating spacers IL may include a silicon oxide film, a silicon oxynitride film, a silicon nitride film, or a combination thereof, without being limited thereto.

As shown in FIGS. 3B and 3C, the back side surface 102B of the substrate 102 may be covered by a back side insulating film 109. The back side insulating film 109 may include a silicon oxide film, a silicon nitride film, silicon carbide film, a low-k dielectric film, or a combination thereof. The low-k dielectric film may include fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

Each of the plurality of power lines PL may pass through the back side insulating film 109 in the vertical direction (Z direction) and be in contact with one end of the back side power rail MW. Each of the plurality of power lines PL may be connected to a corresponding one of the plurality of via power rails VPR through the back side power rail MW.

In the IC device 100 described with reference to FIGS. 1 to 3C, the plurality of dummy gate insulation lines FG may extend lengthwise in the second lateral direction (Y direction) in the inter-cell isolation region FR. From among the plurality of dummy gate insulation lines FG, each of a plurality of dummy gate insulation lines FG, which are between a pair of cells LC that are spaced apart from each other in the first lateral direction (X direction) with the inter-cell isolation region FR therebetween, may have a length in the second lateral direction (Y direction), which is less than a length of at least one of the plurality of gate lines GL in the pair of cells LC in the second lateral direction (Y direction). Accordingly, in the process of manufacturing the IC device 100, line patterns, which are intermediate structures required to form the plurality of dummy gate insulation lines FG, may be prevented from suffering structural defects. For example, the line patterns may be prevented from being bent or leaning in an undesired direction due to stress from surrounding environments. The above-described structural defects in the line patterns may be prevented from adversely affecting nearby structures, for example, a plurality of dummy gate structures (refer to dummy gate structures DGS in FIGS. 5A to 5C), which are intermediate structures required to form the gate lines GL. Thus, the occurrence of defects, such as undesired short circuits or disconnection between conductive lines, may be prevented during the process of manufacturing the IC device 100. As described above, the IC device 100 according to the inventive concept may have a structure that may be obtained using stable processes. Accordingly, the integration density and reliability of the IC device 100 may be improved.

Next, example methods of manufacturing an IC device, according to example embodiments, will be described below.

FIGS. 4A to 12B are cross-sectional views of a process sequence of a method of manufacturing an IC device, according to example embodiments. More specifically, FIGS. 4A, 5A, 6A, 7A, 8A, 9A, 10A, 11A, and 12A are enlarged cross-sectional views of some components in a portion corresponding to the cross-section taken along line X1-X1' of FIG. 1, according to a process sequence. FIGS. 4B, 5B, 6B, 7B, 8B, 9B, 10B, 11B, and 12B are enlarged cross-sectional views of some components in a portion corresponding to the cross-section taken along line X2-X2' of FIG. 1, according to a process sequence. FIGS. 5C, 8C, 9C, and 11C are plan views of a portion corresponding to FIG. 1, according to a process sequence. An example method of manufacturing the IC device 100 described with reference to FIGS. 1 to 3C is described with reference to FIGS. 4A to 12B. In FIGS. 4A to 12B, the same reference numerals are used to denote the same elements as in FIGS. 1 to 3C, and detailed descriptions thereof are not repeated.

Figure 4A:
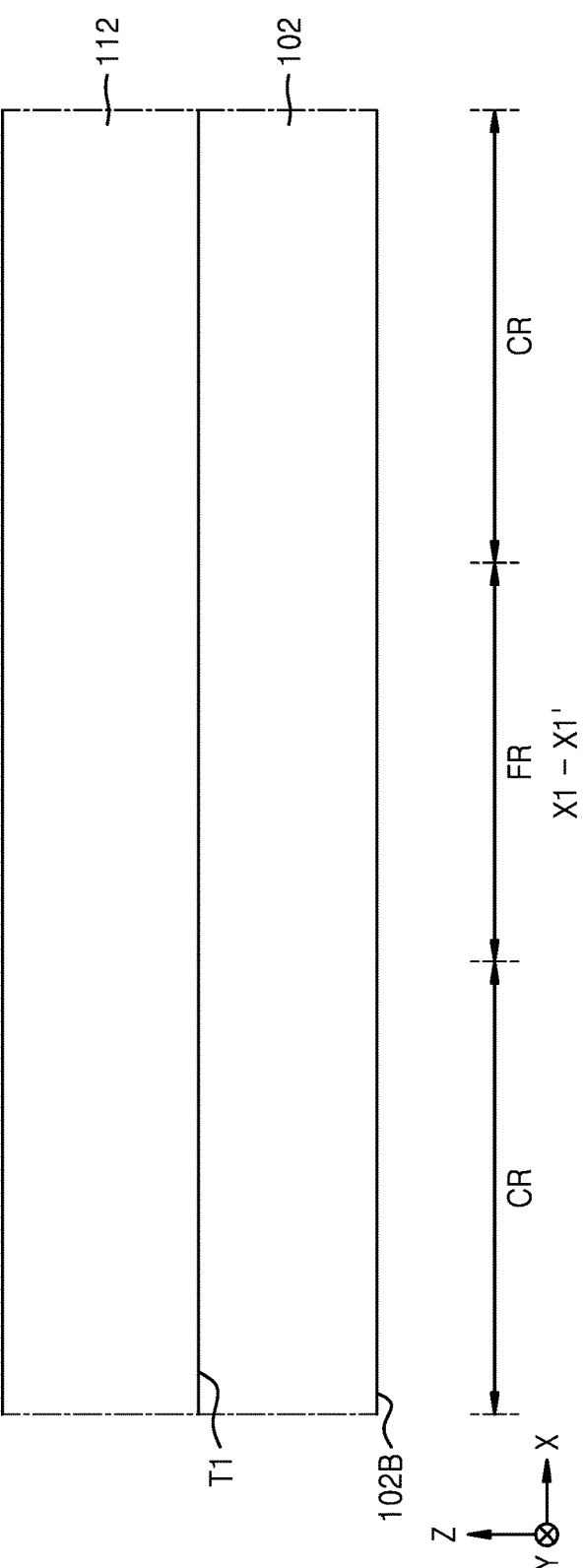
Figure 4B:
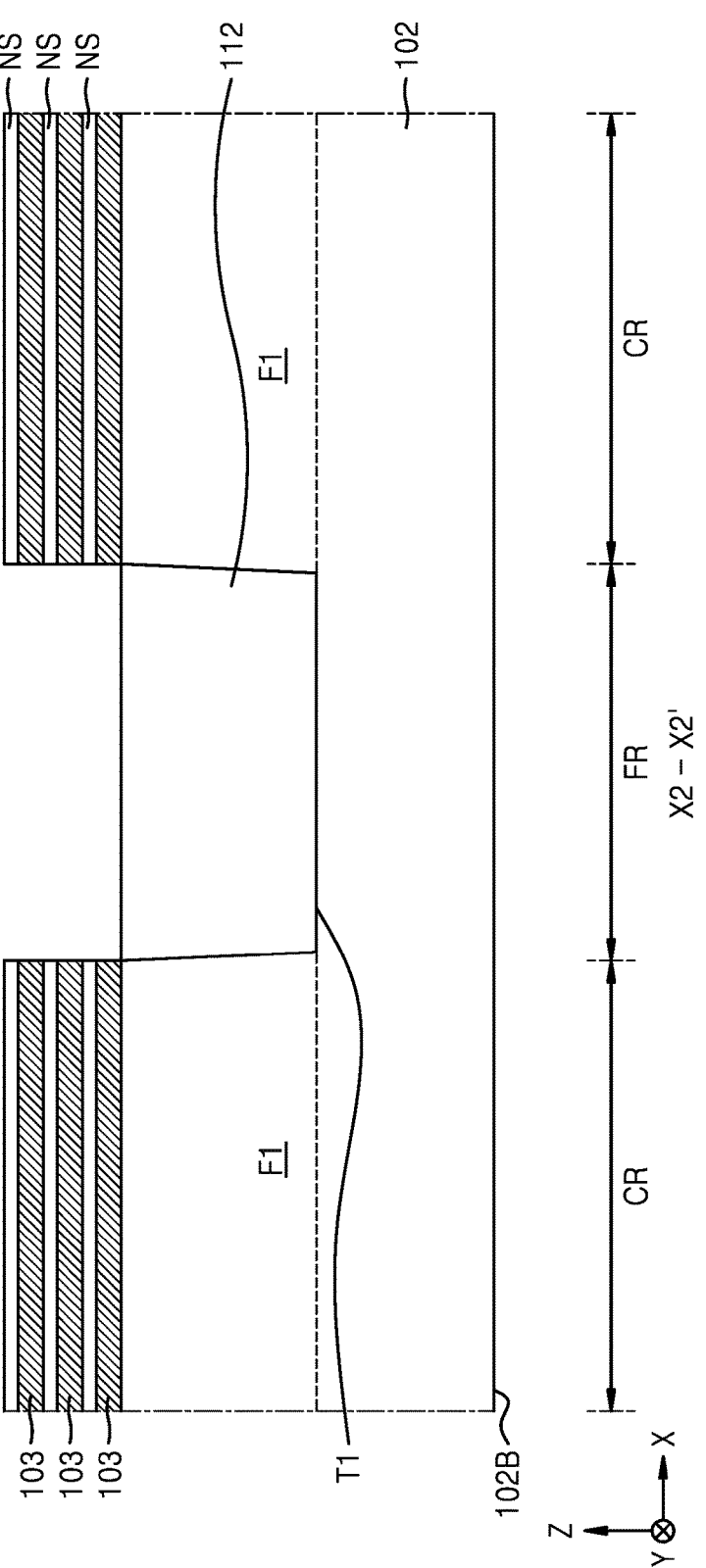

Referring to FIGS. 4A and 4B, a plurality of sacrificial semiconductor layers 103 and a plurality of nanosheet semiconductor layers NS may be alternately stacked one by one on an entire surface of a substrate 102 having a plurality of cell regions CR and an inter-cell isolation region FR arranged between every two adjacent ones of the plurality of cell regions CR.

The plurality of sacrificial semiconductor layers 103 and the plurality of nanosheet semiconductor layers NS may include semiconductor materials having different etch selectivities from each other. In embodiments, the plurality of sacrificial semiconductor layers 103 may include a SiGe layer, and the plurality of nanosheet semiconductor layers NS may include a Si layer. In embodiments, the plurality of sacrificial semiconductor layers 103 may have a constant Ge content. The SiGe layer included in the plurality of sacrificial semiconductor layers 103 may have a constant Ge content, which is selected in a range of about 5 at % to about 60 at %, for example, about 10 at % to about 40 at %. The Ge content of the SiGe layer included in the plurality of sacrificial semiconductor layers 103 may be variously selected as needed.

Thereafter, the plurality of sacrificial semiconductor layers 103, the plurality of nanosheet semiconductor layers NS, and the substrate 102 may be partially etched by using a mask pattern (not shown) as an etch mask, and thus, a plurality of fin-type active regions F1 may be respectively formed in the plurality of cell regions CR on the substrate 102. By forming the plurality of fin-type active regions F1, a plurality of trench regions T1 may be defined on the substrate 102 in the plurality of cell regions CR and the inter-cell isolation region FR. In embodiments, the mask pattern may have a stack structure of an oxide film pattern and a silicon nitride film pattern. The plurality of fin-type active regions F1 may be formed to extend parallel to each other and extend lengthwise in a first lateral direction (X direction). A stack structure of the plurality of sacrificial semiconductor layers 103 and the plurality of nanosheet semiconductor layers NS may remain on a fin top surface FT of each of the plurality of fin-type active regions F1.

A device isolation film 112 filling the trench T1 may be formed between the plurality of fin-type active regions F1. After the device isolation film 112 is formed, the plurality of sacrificial semiconductor layers 103 and the plurality of nanosheet semiconductor layers NS may protrude above a top surface of the device isolation film 112. The device isolation film 112 may include a silicon oxide film, without being limited thereto. The device isolation film 112 may be formed by using a plasma-enhanced chemical vapor deposition (PECVD) process, a high density plasma (HDP) CVD process, an inductively coupled plasma (ICP) CVD process, a capacitor coupled plasma (CCP) CVD process, a flowable CVD (FCVD) process, or a spin coating process.

Figure 5A:
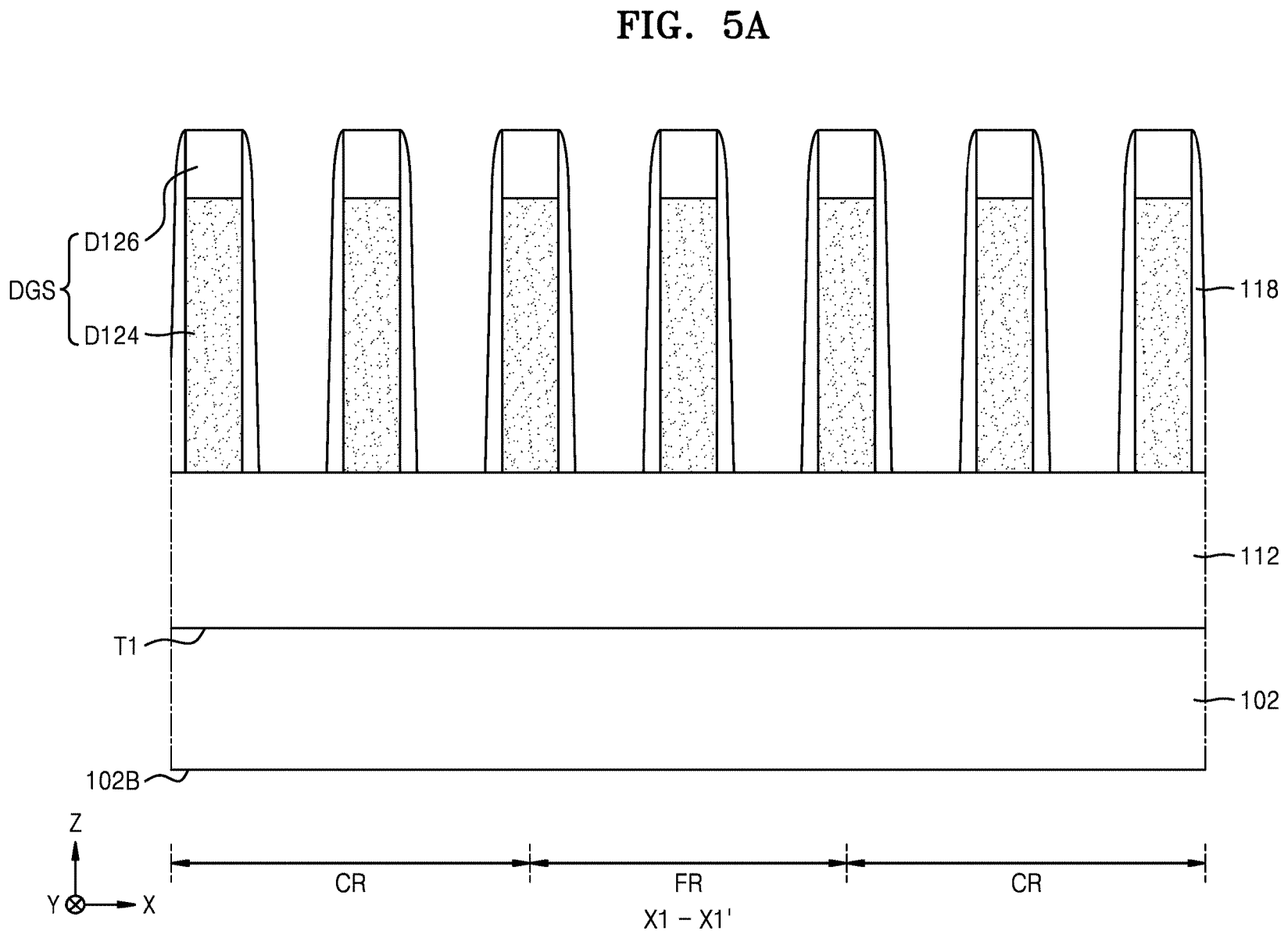
Figure 5B:
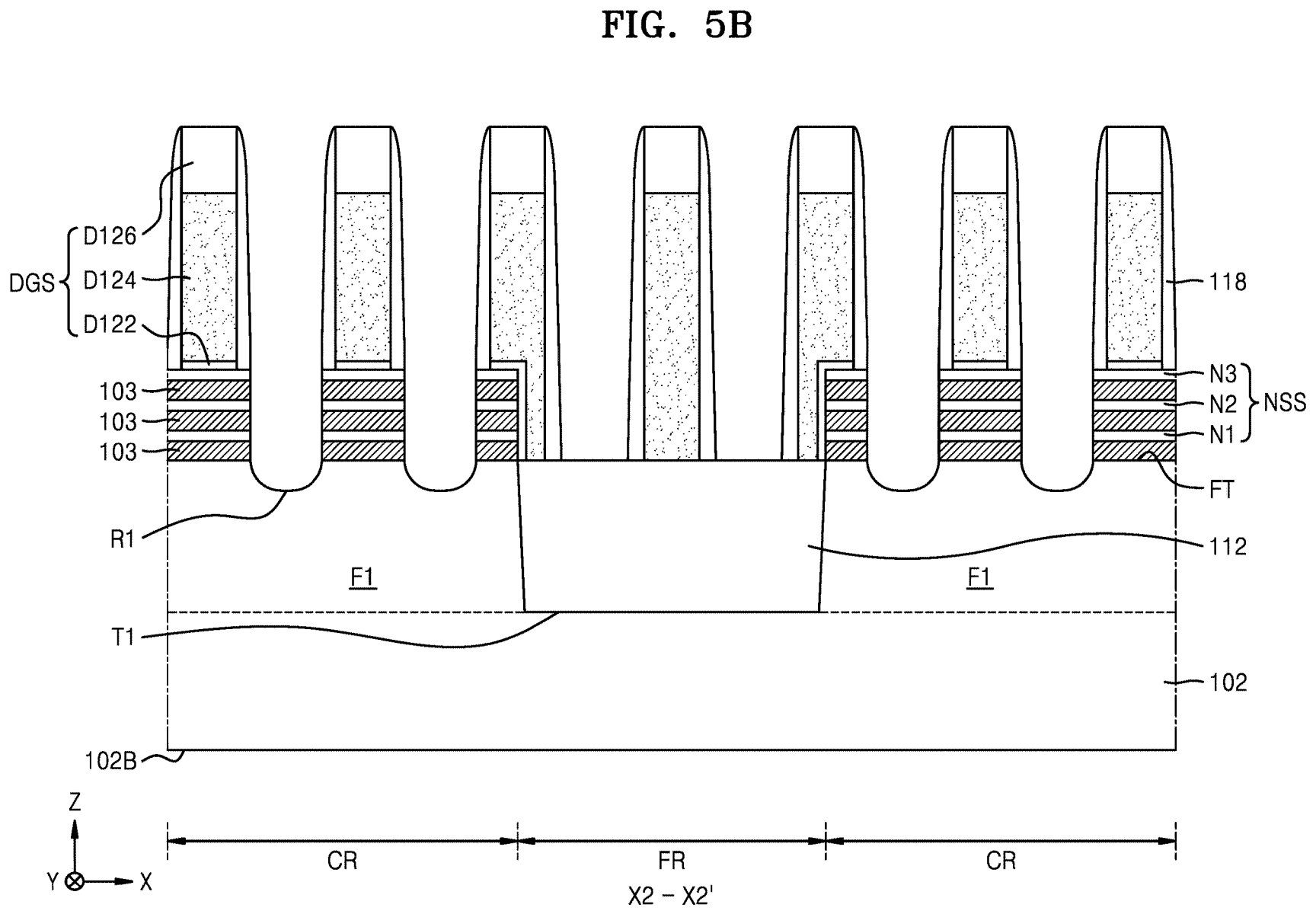
Figure 5C:
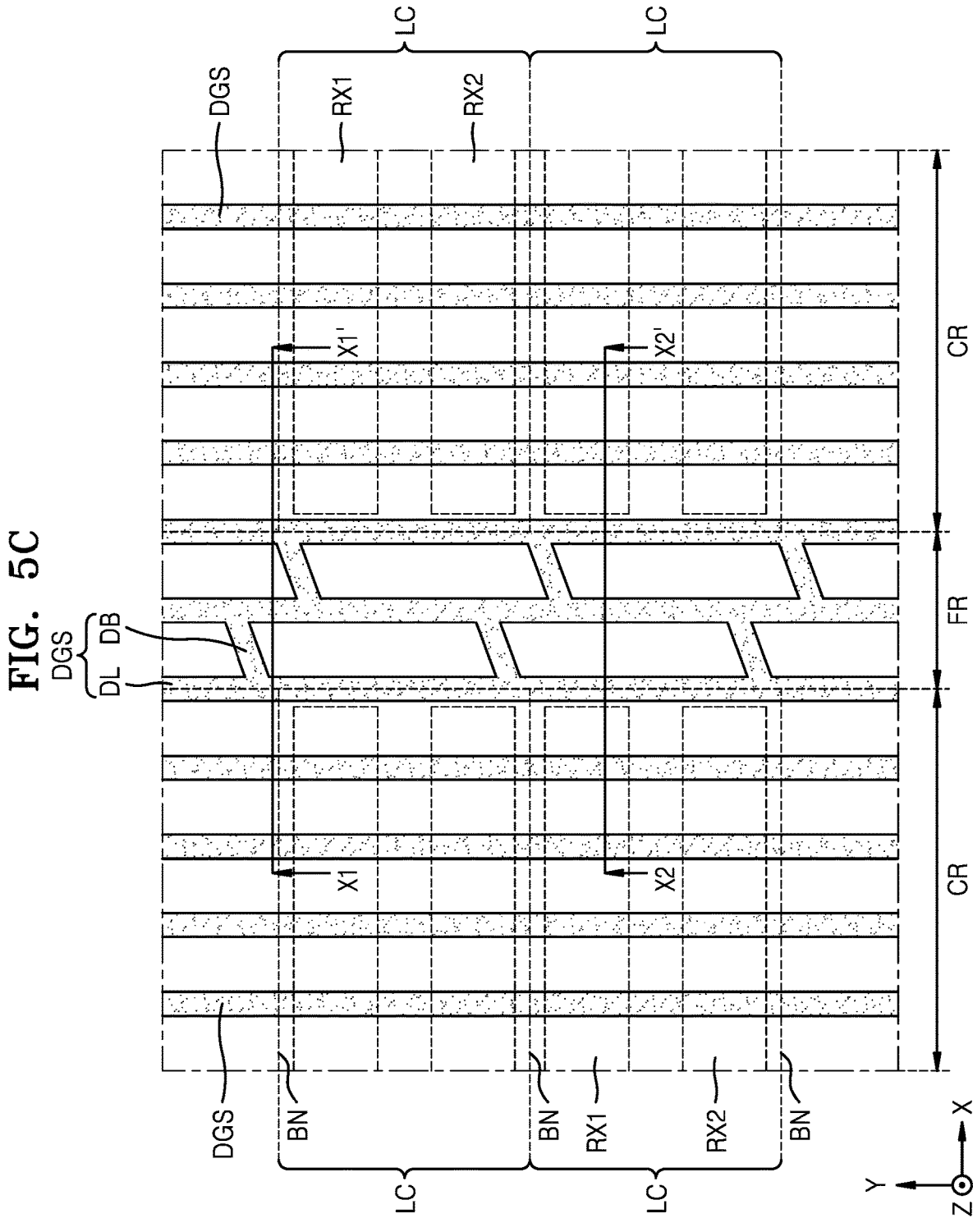

Referring to FIGS. 5A, 5B, and 5C, in the resultant structure of FIGS. 4A and 4B, a plurality of dummy gate structures DGS may be formed in the plurality of cell regions CR and the inter-cell isolation region FR.

As shown in FIG. 5C, from among the plurality of dummy gate structures DGS, a plurality of dummy gate structures DGS in the plurality of cell regions CR may be formed to cover a top surface and sidewalls of a stack structure of the plurality of sacrificial semiconductor layers 103 and the plurality of nanosheet semiconductor layers NS and extend lengthwise in a second lateral direction (Y direction).

As shown in FIG. 5C, from among the plurality of dummy gate structures DGS, a plurality of dummy gate structures DGS in the inter-cell isolation region FR may include a plurality of linear portions DL and a plurality of bridge portions DB. The plurality of linear portions DL may extend lengthwise in the second lateral direction (Y direction). The plurality of bridge portions DB may be integrally connected to each of two linear portions DL, which are adjacent to each other in the first lateral direction (X direction) from among the plurality of linear portions DL, and extend from the two linear portions DL in another direction that intersects with the first lateral direction (X direction). In embodiments, a width of each of the plurality of bridge portions DB may be substantially equal to a width of each of the plurality of linear portions DL. In other embodiments, the width of each of the plurality of bridge portions DB may be less or greater than the width of each of the plurality of linear portions DL.

As shown in FIG. 5C, in the plurality of dummy gate structures DGS arranged in the inter-cell isolation region FR, the plurality of bridge portions DB may be formed to extend lengthwise in an oblique direction between the first lateral direction (X direction) and the second lateral direction (Y direction). However, the inventive concept is not limited thereto. For example, each of the plurality of bridge portions DB may include a portion extending in a direction parallel to the first lateral direction (X direction) or the second lateral direction (Y direction). In other embodiments, the plurality of bridge portions DB may have various shapes including a curved portion and a bent portion in a view from above (e.g., on an X-Y plane).

In each of the plurality of cell regions CR and each of the inter-cell isolation region FR, each of the plurality of dummy gate structures DGS may have a structure in which an oxide film D122, a dummy gate layer D124, and a capping layer D126 are sequentially stacked. In embodiments, the oxide film D122 may be a film obtained by oxidizing the surface of each of the plurality of sacrificial semiconductor layers 103 and the plurality of nanosheet semiconductor layers (refer to nanosheet semiconductor layers NS in FIG. 4B). In this case, as shown in FIGS. 5A and 5B, the top surface of the device isolation film 112 may not be covered by the oxide film D122. In other embodiments, the oxide film D122 may be formed by using a deposition process. In this case, differently from those shown in FIGS. 5A and 5B, the oxide film D122 may be formed to cover the top surface of the device isolation film 112. The dummy gate layer D124 may include polysilicon, and the capping layer D126 may include a silicon nitride film.

As shown in FIG. 5B, a nanosheet stack NSS may be under each of a plurality of dummy gate structures DGS arranged in the plurality of cell regions CR, from among the plurality of dummy gate structures DGS. Accordingly, each of the plurality of dummy gate structures DGS may be physically supported by the nanosheet stack NSS. Thus, there may be a reduction of structural defects, such as the bending or leaning of the plurality of dummy gate structures DGS in an undesired direction due to stress from surrounding environments in a subsequent process.

Although the nanosheet stack NSS is not present under each of the plurality of dummy gate structures DGS3 located in the inter-cell isolation region FR, from among the plurality of dummy gate structures DGS, the plurality of dummy gate structures DGS3 arranged in the inter-cell isolation region FR may respectively include a plurality of linear portions DL and a plurality of bridge portions DB connected to the plurality of linear portions DL as shown in FIG. 5C. Accordingly, the plurality of linear portions DL included in the plurality of dummy gate structures DGS may be supported by the plurality of bridge portions DB. Thus, there may be a reduction of structural defects, such as the bending or leaning of the plurality of linear portions DL in an undesired direction due to stress from surrounding environments in a subsequent process. Therefore, the plurality of dummy gate structures DGS in the plurality of cell regions CR may be prevented from being adversely affected due to structural defects, such as the bending or leaning of the plurality of dummy gate structures DGS. As a result, in a subsequent process, a plurality of gate lines GL obtained from the plurality of dummy gate structures DGS arranged in the plurality of cell regions CR may be at desired positions with high precision. Therefore, in the process of manufacturing the IC device 100, the occurrence of defects, such as undesired short circuits or disconnection between the plurality of gate lines GL and conductive lines adjacent thereto, may be prevented.

As shown in FIGS. 5A and 5B, a plurality of insulating spacers 118 may be formed to cover both sidewalls of the plurality of dummy gate structures DGS, respectively. Thereafter, a portion of each of the plurality of sacrificial semiconductor layers 103 and the plurality of nanosheet semiconductor layers NS and a portion of the fin-type active region F1 may be selectively etched by using the plurality of dummy gate structures DGS and the plurality of insulating spacers 118 as etch masks. Thus, the plurality of nanosheet semiconductor layers (refer to NS in FIG. 4B) may be divided into a plurality of nanosheet stacks NSS, each of which includes a first nanosheet N1, a second nanosheet N2, and a third nanosheet N3, and a plurality of recesses R1 may be formed in upper portions of the plurality of fin-type active regions F1. To form the plurality of nanosheet stacks NSS and the plurality of recesses R1, an etching process may be performed by using a dry etching process, a wet etching process, or a combination thereof.

Figure 6A:
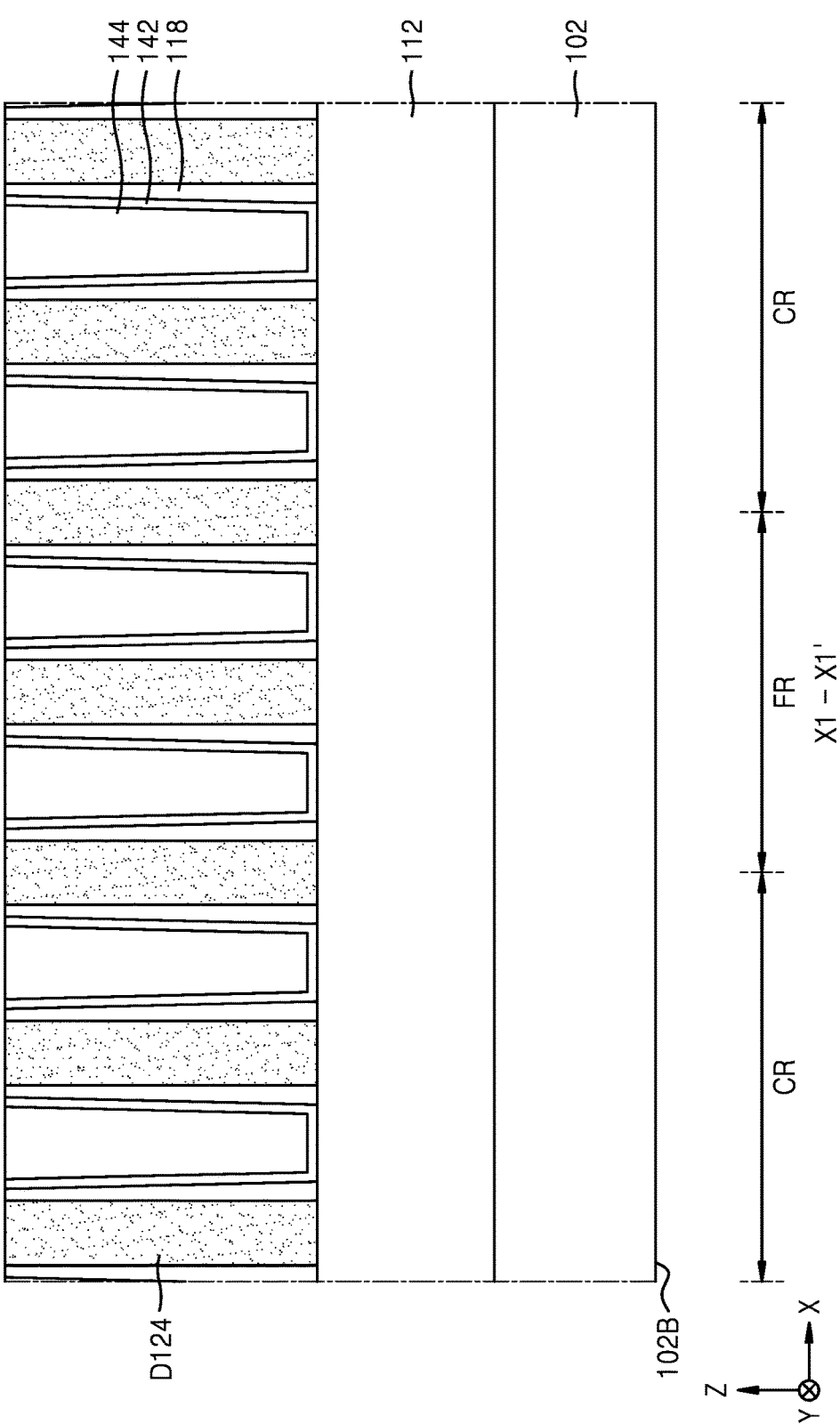
Figure 6B:
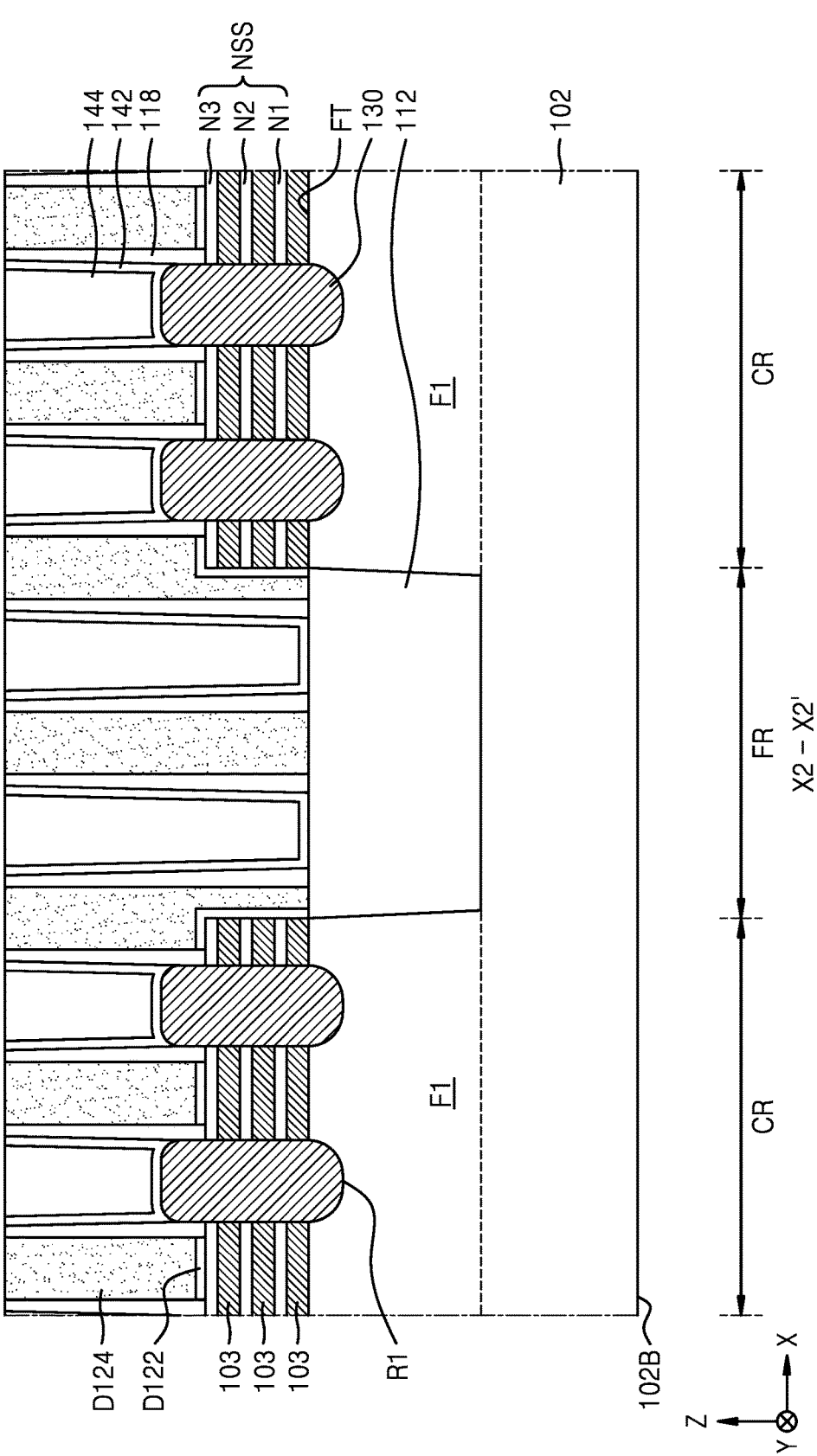

Referring to FIGS. 6A and 6B, in the resultant structure of FIGS. 5A, 5B, and 5C, a plurality of source/drain regions 130 may be formed to fill the plurality of recesses R1. To form the plurality of source/drain regions 130, a semiconductor material may be epitaxially grown from a surface of the fin-type active region F1, which is exposed at a bottom surface of each of the plurality of recesses R1, and a sidewall of each of the first to third nanosheets N1, N2, and N3 included in the nanosheet stack NSS.

Thereafter, an insulation liner 142 may be formed to cover the resultant structure including the plurality of source/drain regions 130, and an inter-gate insulating film 144 may be formed on the insulation liner 142. Thereafter, a portion of each of the insulation liner 142 and the inter-gate insulating film 144 may be etched to expose top surfaces of a plurality of capping layers D126. Afterwards, the dummy gate layer D124 may be exposed by removing the plurality of capping layers D126, and the insulation liner 142 and the inter-gate insulating film 144 may be partially removed such that a top surface of the inter-gate insulating film 144 and a top surface of the dummy gate layer D124 substantially become at the same level as each other.

Figure 7A:
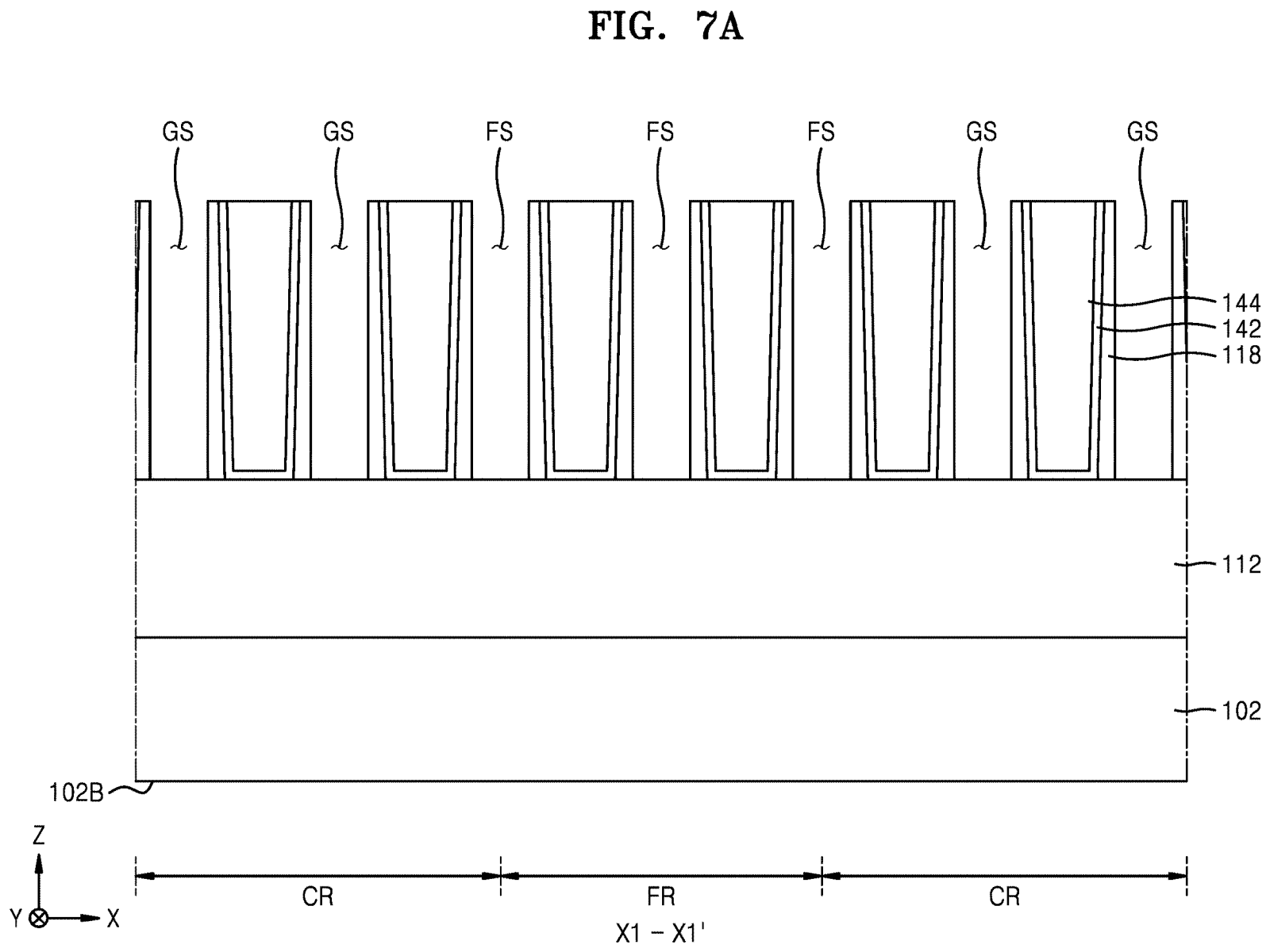
Figure 7B:
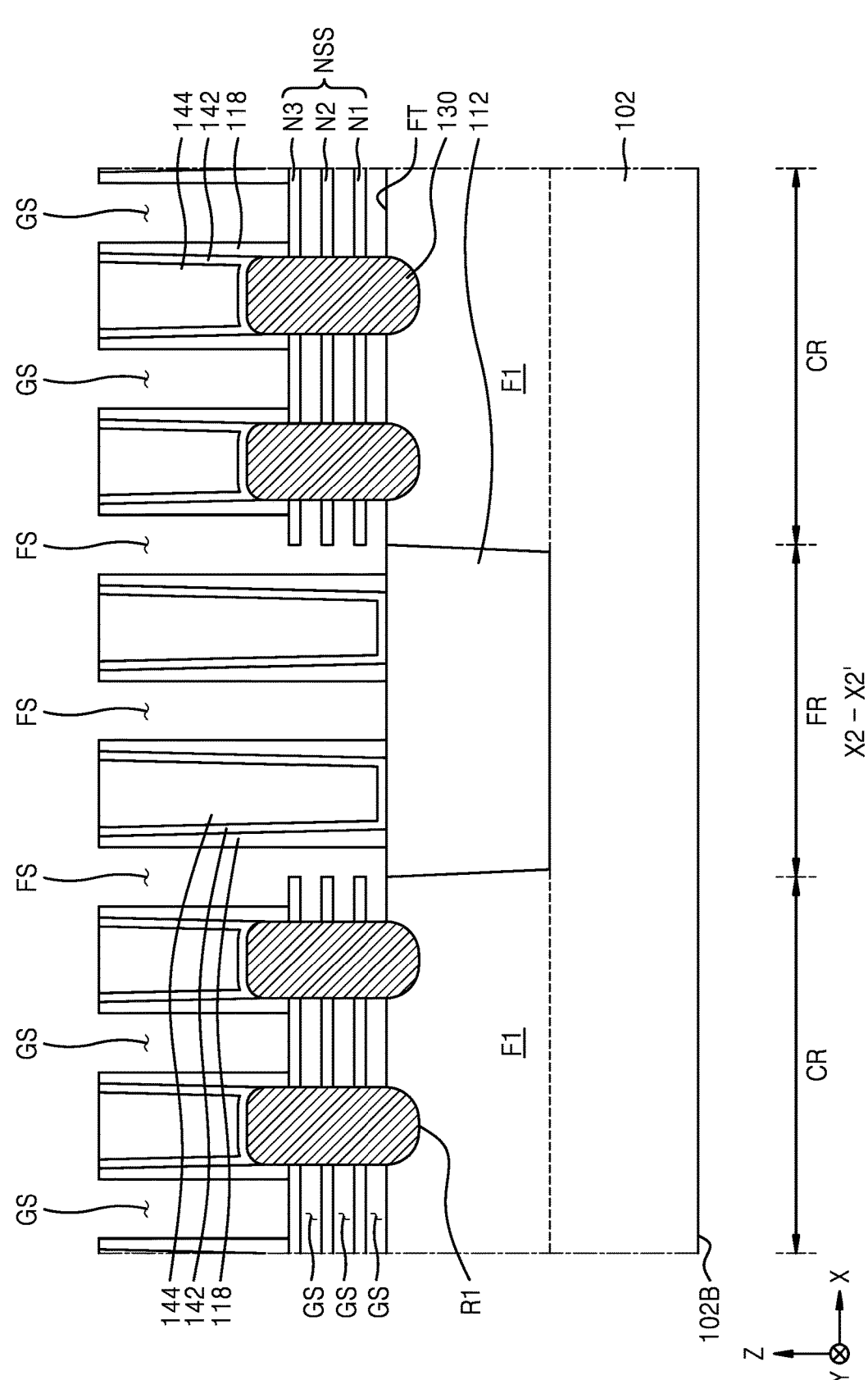

Referring to FIGS. 7A and 7B, the dummy gate layer D124 and the oxide film D122 located thereunder may be removed from the resultant structure of FIGS. 6A and 6B. Subsequently, the plurality of sacrificial semiconductor layers 103 remaining on the fin-type active region F1 may be selectively removed through spaces from which the dummy gate layer D124 and the oxide film D122 are removed. In embodiments, to selectively remove the plurality of sacrificial semiconductor layers 103, differences in etch selectivity between the first to third nanosheets N1, N2, and N3 and the plurality of sacrificial semiconductor layers 103 may be used. A liquid or gaseous etchant may be used to selectively remove the plurality of sacrificial semiconductor layers 103. In embodiments, to selectively remove the plurality of sacrificial semiconductor layers 103, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

After the plurality of sacrificial semiconductor layers 103 are selectively removed, a plurality of gate spaces GS extending lengthwise in a second lateral direction (Y direction) may be formed in a plurality of cell regions CR, and the plurality of nanosheet stacks NSS may be exposed through the plurality of gate spaces GS. A plurality of dummy gate spaces FS extending lengthwise in the second lateral direction (Y direction) may be formed in the inter-cell isolation region FR, and the top surface of the device isolation film 112 may be exposed through a plurality of dummy gate spaces FS. Pieces of the first to third nanosheets N1, N2, and N3, which remain on an end portion of the fin-type active region F1 adjacent to the inter-cell isolation region FR, and the top surface of the device isolation film 112 may be exposed together in a dummy gate space FG passing through a boundary between the inter-cell isolation region FR and the cell region CR, from among the plurality of dummy gate spaces FG.

Figure 8A:
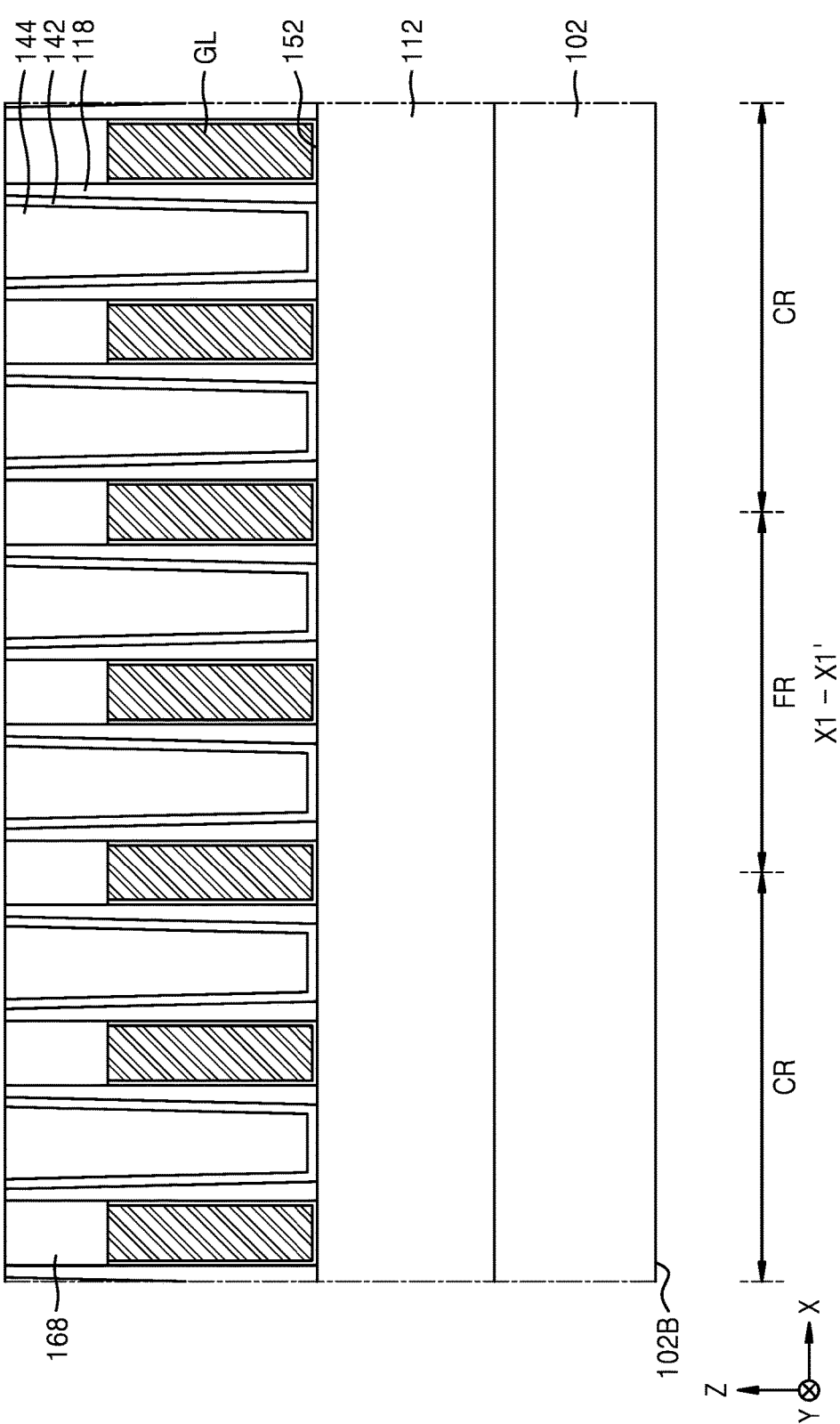
Figure 8B:
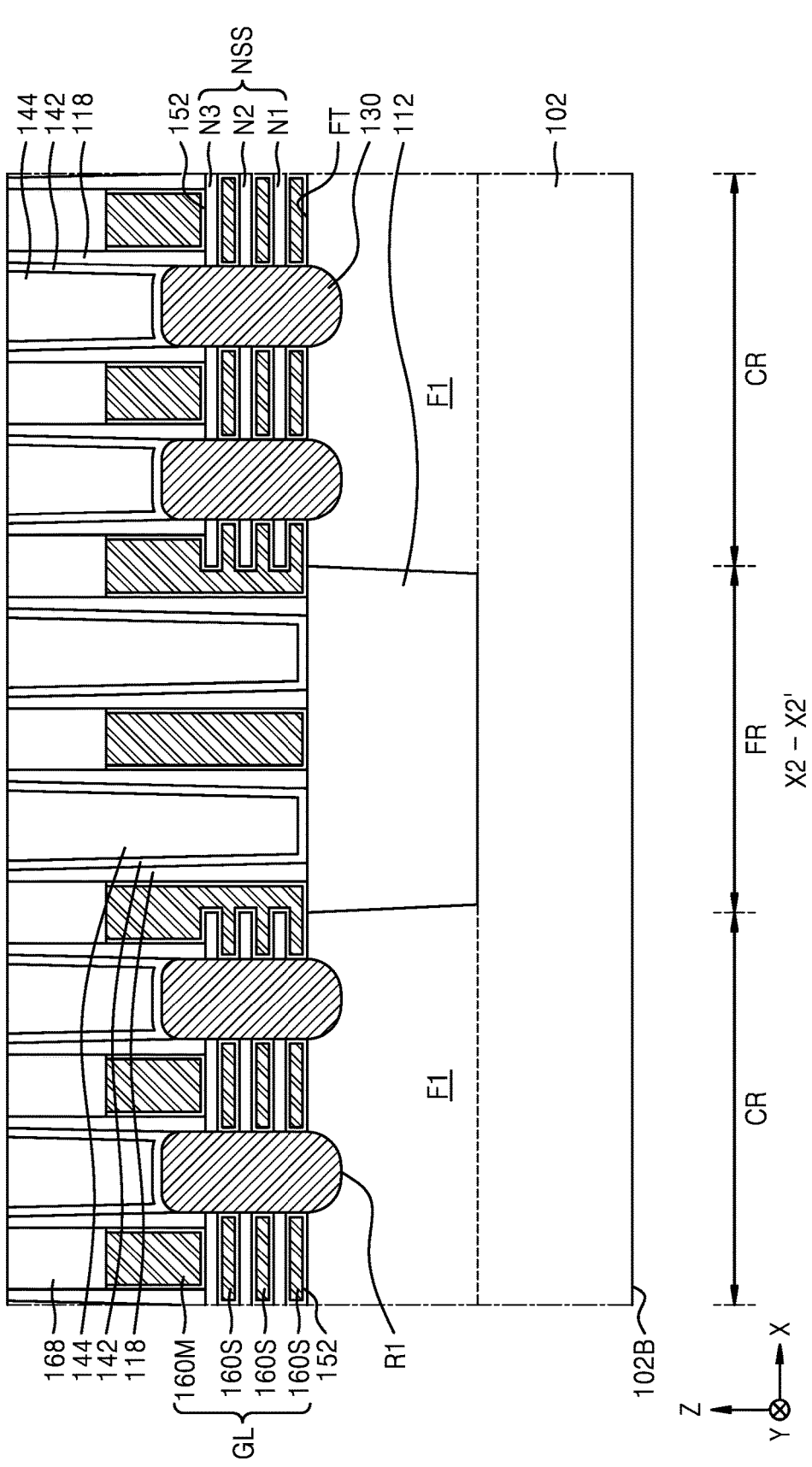
Figure 8C:
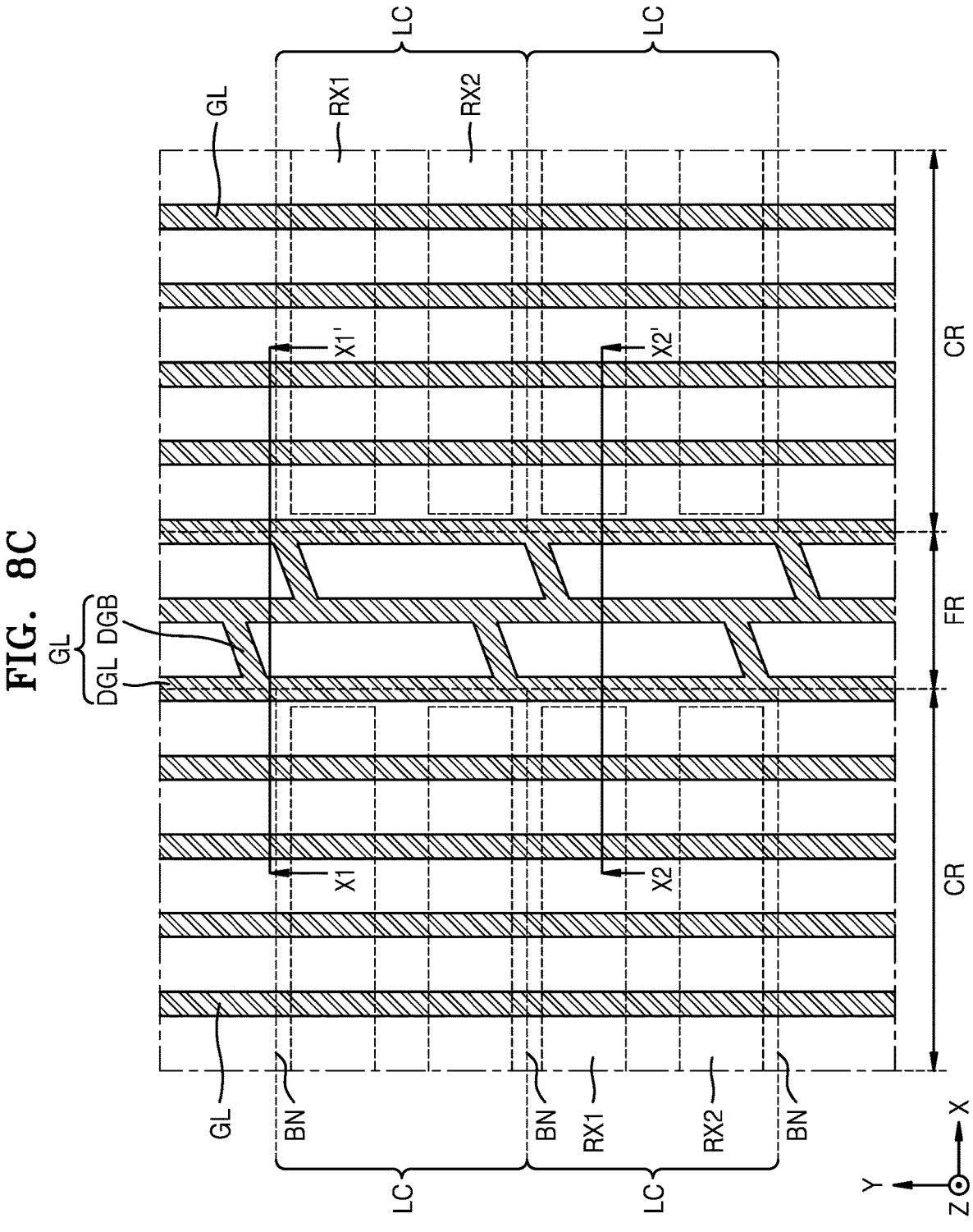

Referring to FIGS. 8A, 8B, and 8C, in the resultant structure of FIGS. 7A and 7B, a gate dielectric film 152 may be formed to cover exposed surfaces through the plurality of gate spaces GS and the plurality of dummy gate spaces FS. The gate dielectric film 152 may be formed to cover respective surfaces of the first to third nanosheets N1, N2, and N3 and the fin-type active region F1 and respective surfaces of the device isolation film 112 and the insulating spacers 118. The gate dielectric film 152 may be formed by using an atomic layer deposition (ALD) process.

Afterwards, the gate line GL may be formed to fill a portion of each of the plurality of gate spaces GS and the plurality of dummy gate spaces FS on the gate dielectric film 152, and a capping insulating pattern 168 may be formed to cover the top surface of each of the gate line GL and the gate dielectric film 152 in each of the plurality of gate spaces GS and the plurality of dummy gate spaces FS.

FIG. 8C illustrates a planar structure of the plurality of gate lines GL formed on the substrate 102. As shown in FIG. 8C, from among the plurality of gate lines GL, a plurality of gate lines GL arranged in the plurality of cell regions CR may extend lengthwise in the second lateral direction (Y direction) on the plurality of fin-type active regions F1. From among the plurality of gate lines GL, a plurality of gate lines GL arranged in the inter-cell isolation region FR may include a plurality of linear gate portions DGL and a plurality of bridge gate portions DGB. The plurality of linear gate portions DGL may extend lengthwise in the second lateral direction (Y direction). The plurality of bridge gate portions DGB may be integrally connected to each of two linear gate portions DGL, which are adjacent to each other in the first lateral direction (X direction) from among the plurality of linear gate portions DGL. The plurality of bridge gate portions DGB may extend from the two linear gate portions DGL in another direction that intersects with the first lateral direction (X direction). Planar shapes of the plurality of linear gate portions DGL and the plurality of bridge gate portions DGB, which are included in the plurality of gate lines GL in the inter-cell isolation region FR may correspond to planar shapes of the linear portions DL and the plurality of bridge portions DB, which are included in the plurality of dummy gate structures DGS that are formed according to the processes described with reference to FIGS. 5A, 5B, and 5C.

Figure 9A:
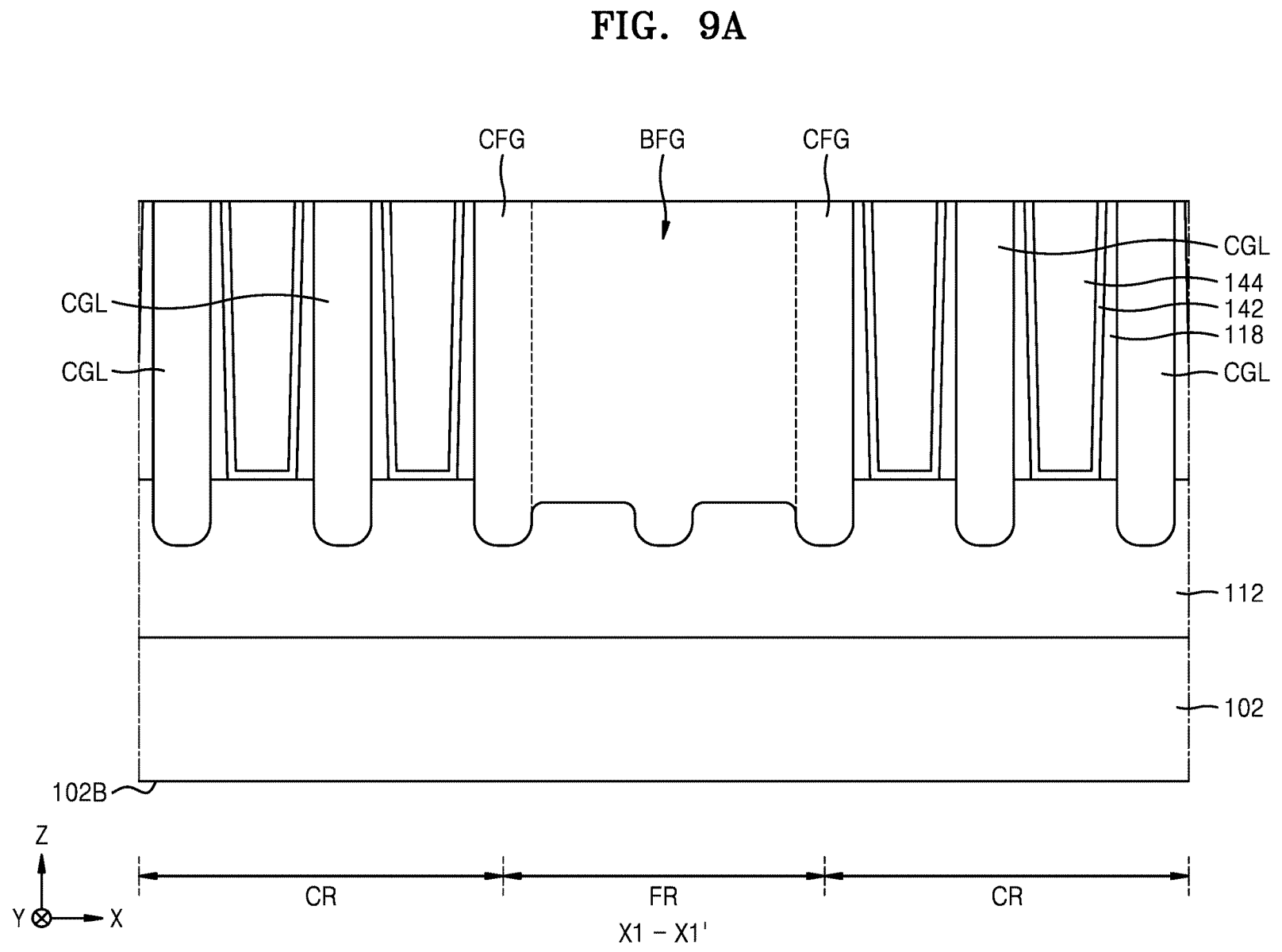
Figure 9B:
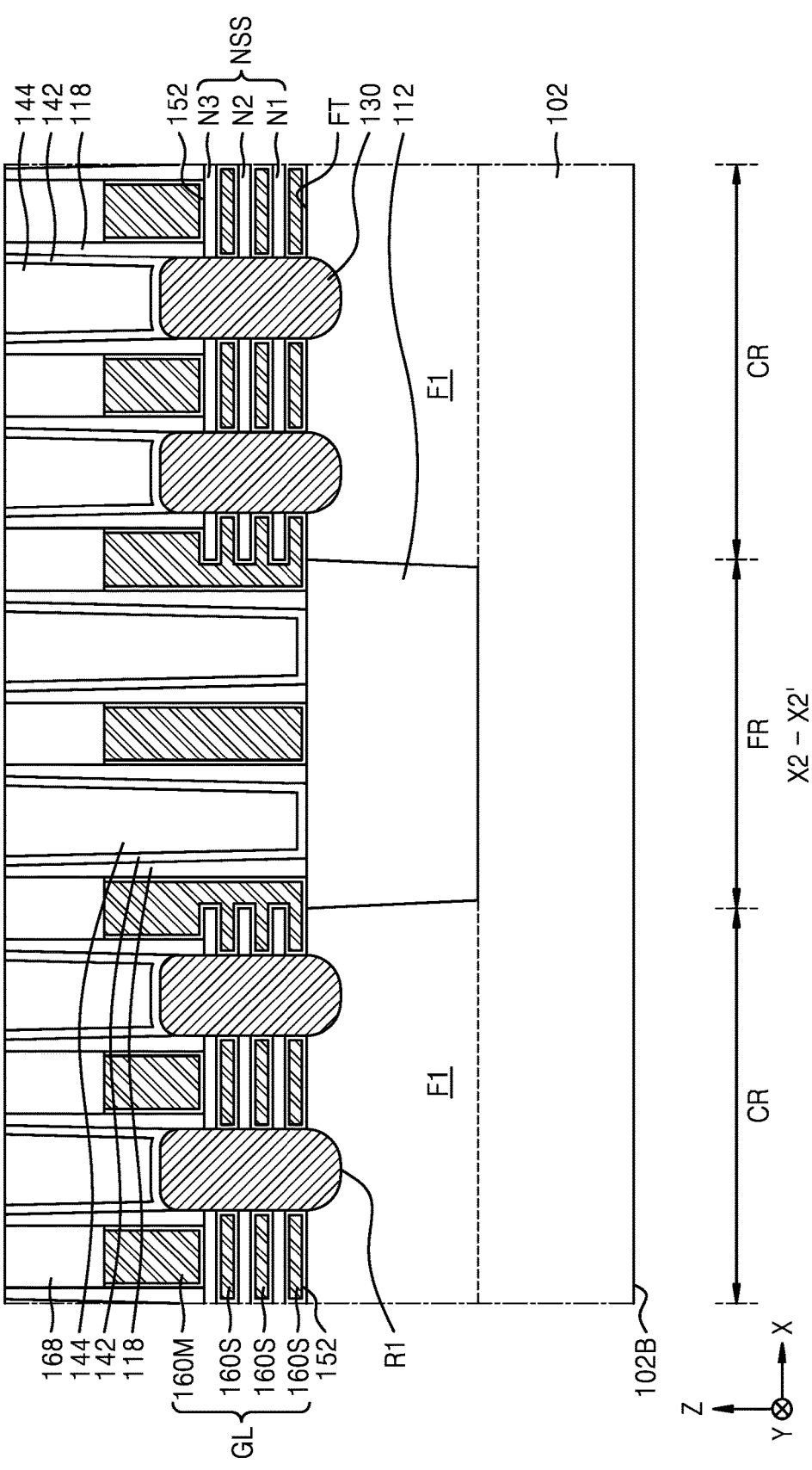
Figure 9C:
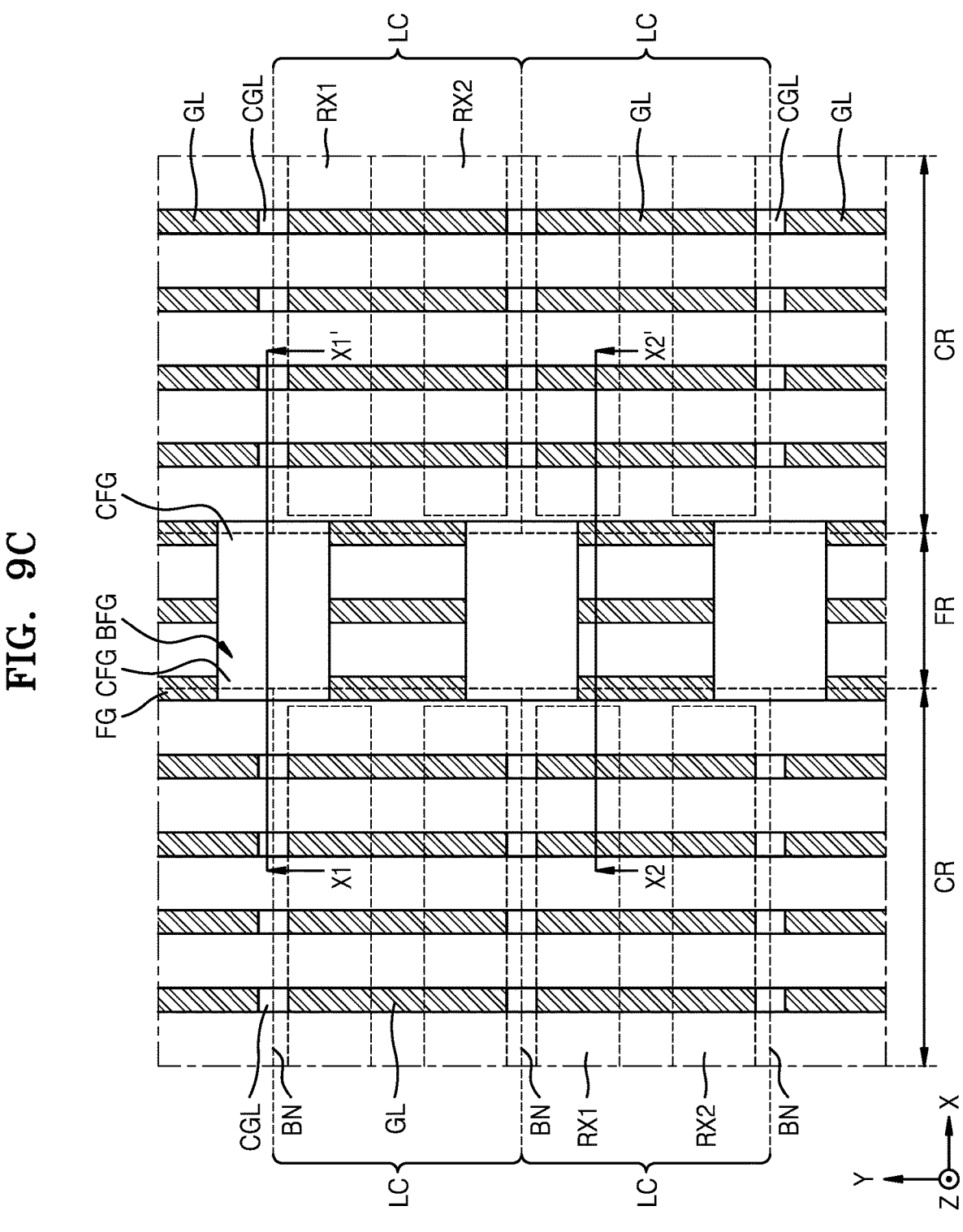

Referring to FIGS. 9A, 9B, and 9C, in the resultant structure of FIGS. 8A, 8B, and 8C, in cut regions selected along a cell boundary of each of a pair of cells LC, which are adjacent to each other in the second lateral direction (Y direction), in the first lateral direction (X direction) and an extension line of the cell boundary, a plurality of gate cut insulating patterns CGL and a plurality of bridge insulating patterns BFG may be formed by replacing the gate line GL, the gate dielectric film 152, and the capping insulating pattern 168 by an insulating material.

More specifically, to form the plurality of gate cut insulating patterns CGL and the plurality of bridge insulating patterns BFG, to begin with, a gate cut mask pattern (not shown) having a plurality of cut openings exposing the cut regions on the substrate 102 may be formed in the resultant structure of FIGS. 8A, 8B, and 8C, and portions corresponding to the cut regions may be removed from a plurality of capping insulating patterns 168, the plurality of gate lines GL, and a plurality of gate dielectric films 152, which are in the resultant structure of FIGS. 8A, 8B, and 8C, by using the gate cut mask pattern as an etch mask. Thus, a plurality of cut spaces may be prepared. Afterwards, the gate cut mask pattern may be removed, and an isolation insulating film may be formed to fill the plurality of cut spaces. The isolation insulating film may be planarized to expose top surfaces of the plurality of capping insulating patterns 168 remaining on the substrate 102, and thus, the plurality of gate cut insulating patterns CGL and the plurality of bridge insulating patterns BFG may remain on the substrate 102. The isolation insulating film may include a silicon nitride film, without being limited thereto.

In this case, a length of at least some of the plurality of bridge insulating patterns BFG may become greater than a length of the plurality of gate cut insulating patterns CGL in the second lateral direction (Y direction). To this end, when the plurality of cut openings are formed in the gate cut mask pattern, a width of the plurality of cut openings in the second lateral direction (Y direction) in the inter-cell isolation region FR) may become greater than a width of the plurality of cut openings in the second lateral direction (Y direction) in the plurality of cell regions CR. Because the plurality of cut openings formed in the gate cut mask pattern have a greater width in the inter-cell isolation region FR than in the plurality of cell regions CR in the second lateral direction (Y direction) as described above, when etching processes for removing portions corresponding to the cut regions from the plurality of capping insulating patterns 168, the plurality of gate lines GL, and the plurality of gate dielectric films 152 are performed in the inter-cell isolation region FR, at least a portion of each of the insulating spacers 118, the insulation liner 142, and the inter-gate insulating film 144, which are adjacent to films to be etched and are exposed through the cut regions, may be removed together due to an etching atmosphere used in the etching processes. In this state, after the isolation insulating film are formed to fill the plurality of cut spaces and planarized to expose the top surfaces of the plurality of capping insulating patterns 168 remaining on the substrate 102 as described above, the plurality of bridge insulating patterns BFG remaining in the inter-cell isolation region FR may include only the isolation insulating film or a combination of the isolation insulating film and other films. For example, the plurality of bridge insulating patterns BFG may include a combination of the remaining unremoved portions of the insulating spacers 118, the insulation liner 142, and the inter-gate insulating film 144, which were exposed through the cut regions in the inter-cell isolation region FR, and the isolation insulating film.

Although FIG. 9C illustrates a case in which each of the plurality of bridge insulating patterns BFG has a substantially rectangular planar shape, the inventive concept is not limited thereto. For example, depending on a planar shape of the plurality of cut openings formed in the gate cut mask pattern in the inter-cell isolation region FR or a shape of the resultant structure obtained after the etching process is performed on the portions exposed through the cut regions, a planar shape of the bridge insulating pattern BFG may have various shapes, such as an elliptical shape, a rhombus shape, and an irregular polygonal shape.

As shown in FIGS. 9A and 9C, each of the plurality of bridge insulating patterns BFG may include a bridge insulating edge portion CFG, which is in an extension line of the cell boundary BN of the cell LC in a second lateral direction (Y direction). For example, each bridge insulating edge portion CFG may overlap a line extending from the cell boundary BN of the cell LC in the second lateral direction (Y direction).

Figure 10A:
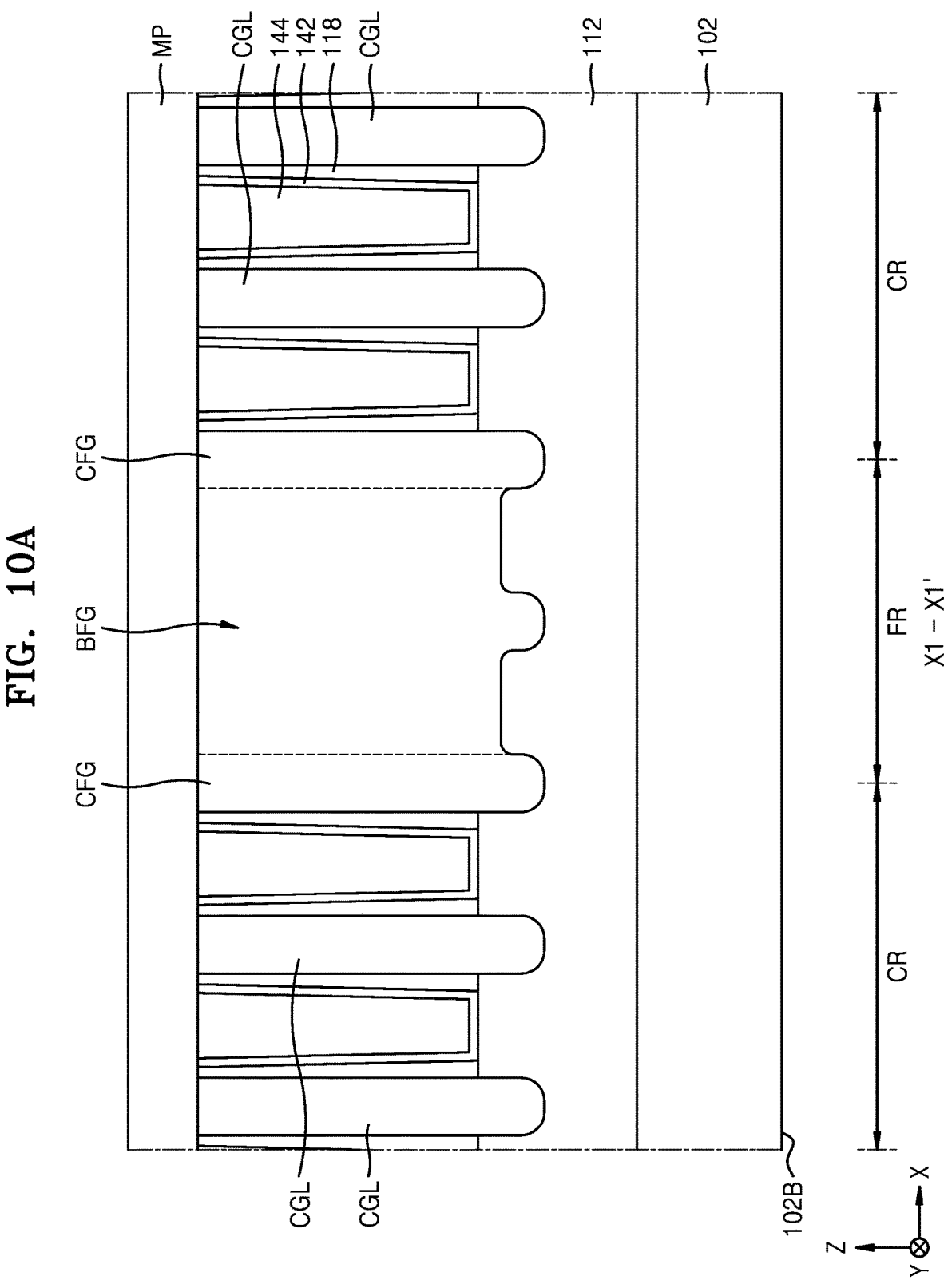
Figure 10B:
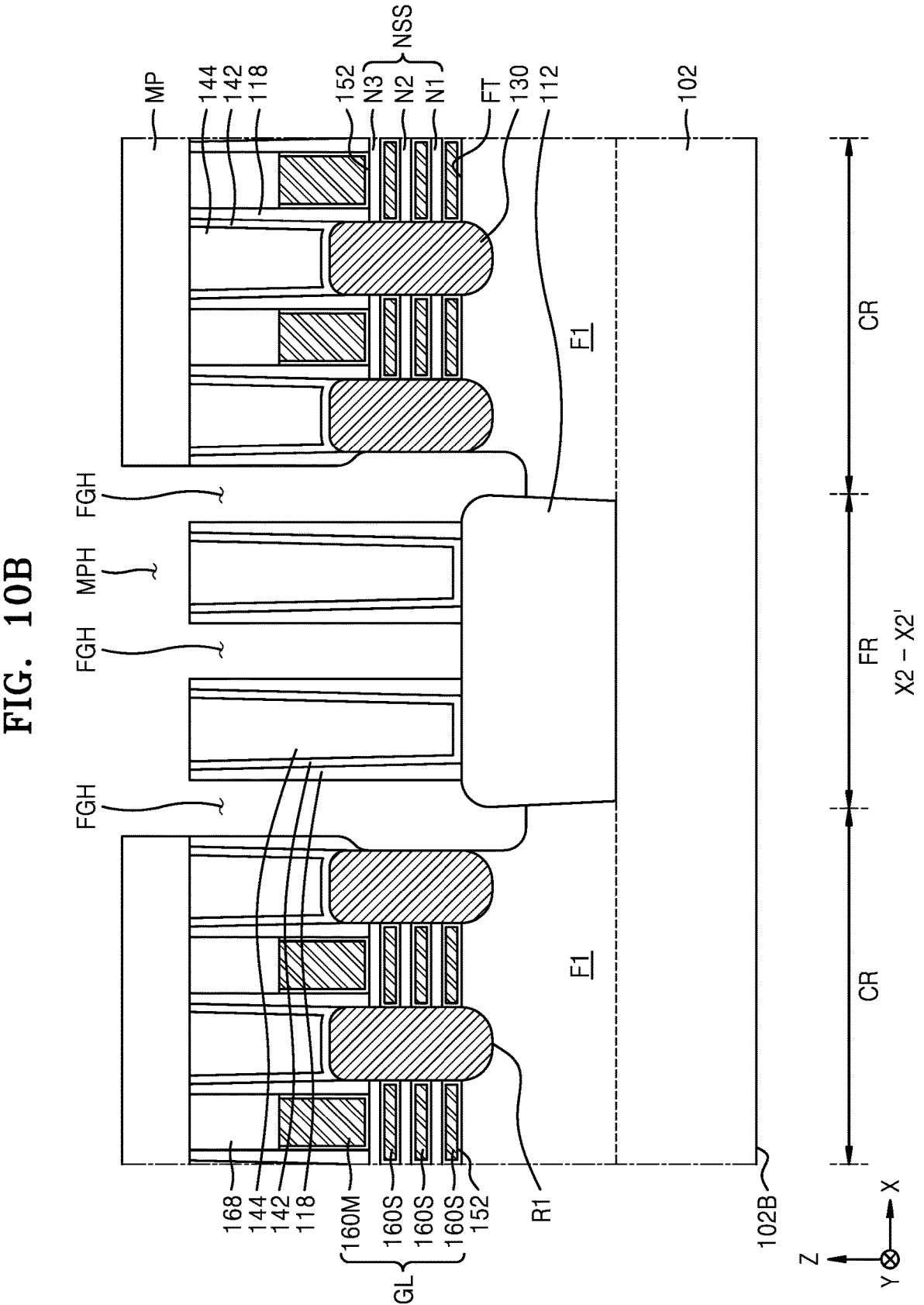

Referring to FIGS. 10A and 10B, in the resultant structure of FIGS. 9A, 9B, and 9C, a mask pattern MP may be formed to have an opening MPH exposing a partial region. The partial region may include a region of the inter-cell isolation region FR, except for portions in which the plurality of bridge insulating patterns BFG are formed, and the cell boundary (refer to cell boundary BN in FIG. 1) of each of a plurality of cells LC, which is adjacent to the inter-cell isolation region FR. Thereafter, the plurality of capping insulating patterns 168, the plurality of gate lines GL, and the plurality of gate dielectric films 152 may be removed by using the mask pattern MP as an etch mask through the opening MPH in the partial region including the inter-cell isolation region FR and the cell boundary BN of each of the plurality of cells LC, which is adjacent to the inter-cell isolation region FR. Thus, a plurality of dummy insulating spaces FGH may be formed.

In embodiments, to form the plurality of dummy insulating spaces FGH, due to an etching atmosphere used in the etching process for removing the plurality of capping insulating patterns 168, the plurality of gate lines GL, and the plurality of gate dielectric films 152, pieces of the first to third nanosheets N1, N2, and N3, which remain on an end portion of the fin-type active region F1 adjacent to the inter-cell isolation region FR, and a portion of the fin-type active region F1 may be removed together through a dummy insulating space FGH passing through a boundary between the inter-cell isolation region FR and the cell region CR, from among the plurality of dummy insulating spaces FGH.

Respective partial regions of the plurality of fin-type active regions F1 and partial regions of the device isolation film 112 may be exposed through the plurality of dummy insulating spaces FGH. A vertical level of surfaces of the plurality of fin-type active regions F1, which are exposed through bottom surfaces of the plurality of dummy insulating spaces FGH, may be closer to the substrate 102 than the surface of the device isolation film 112, which is exposed through the bottom surfaces of the plurality of dummy insulating spaces FGH.

In other embodiments, differently from that shown in FIG. 10A, the mask pattern MP may be formed to expose the plurality of bridge insulating patterns BFG through the opening MPH of the mask pattern MP. Even when the plurality of bridge insulating patterns BFG are exposed through the opening MPH as described above, an etching process for forming the plurality of dummy insulating spaces FGH may be performed under an etching atmosphere in which an etching selectivity is controlled to selectively remove the plurality of capping insulating patterns 168, the plurality of gate lines GL, and the plurality of gate dielectric films 152 with respect to each of the plurality of bridge insulating patterns BFG, the insulating spacers 118, the insulation liner 142, and the inter-gate insulating film 144, which are exposed together through the opening MPH.

Figure 11A:
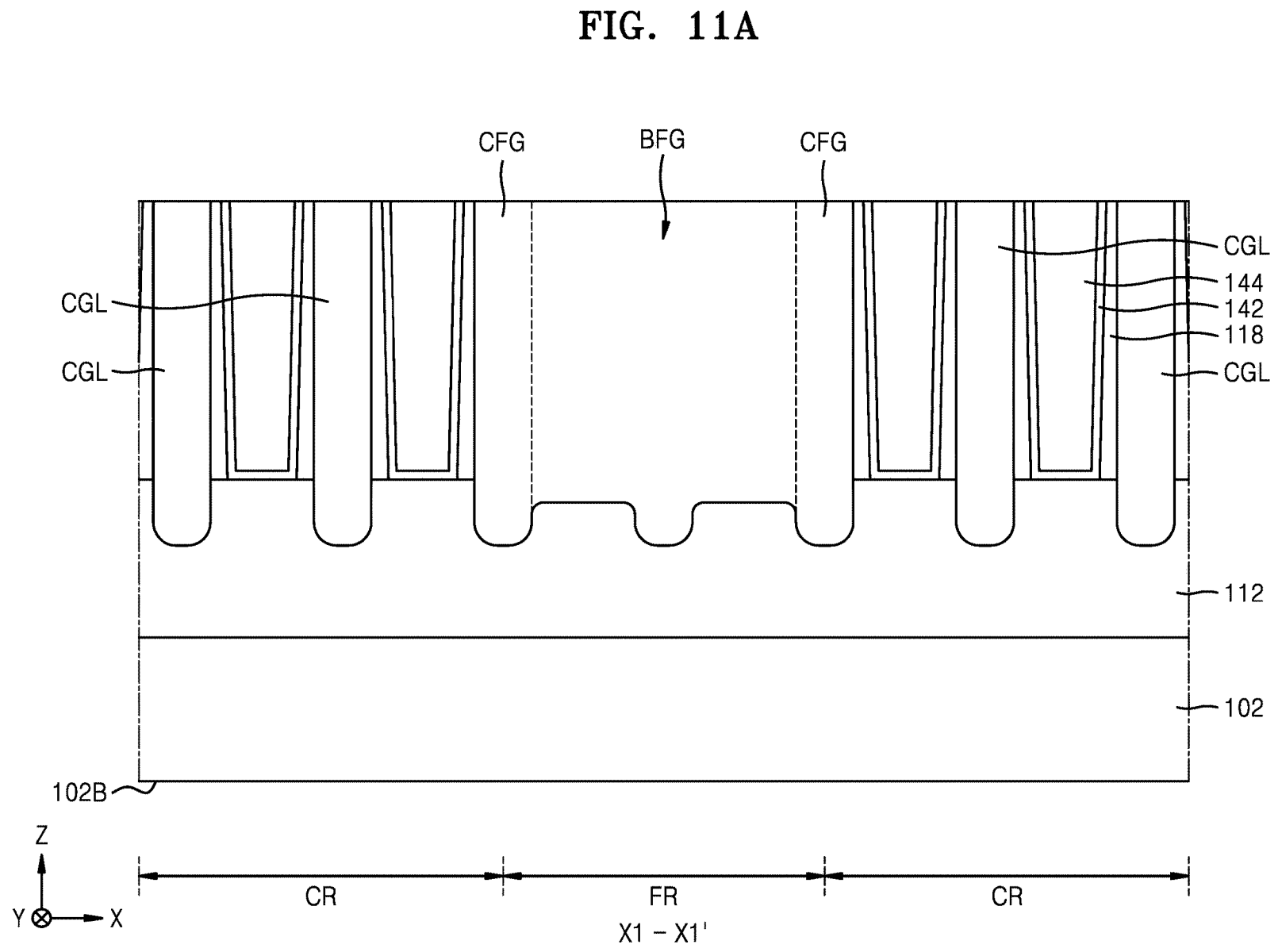
Figure 11B:
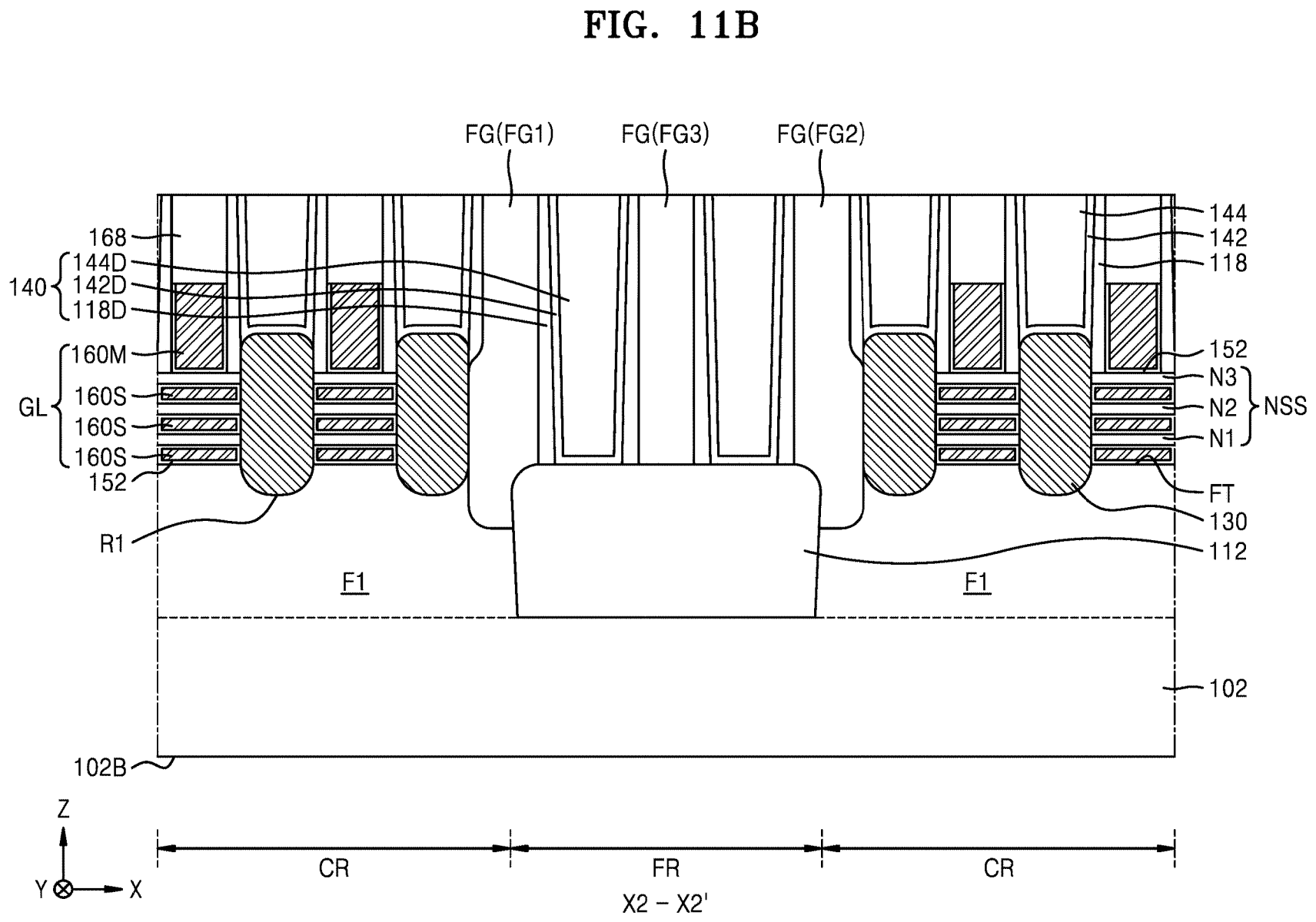
Figure 11C:
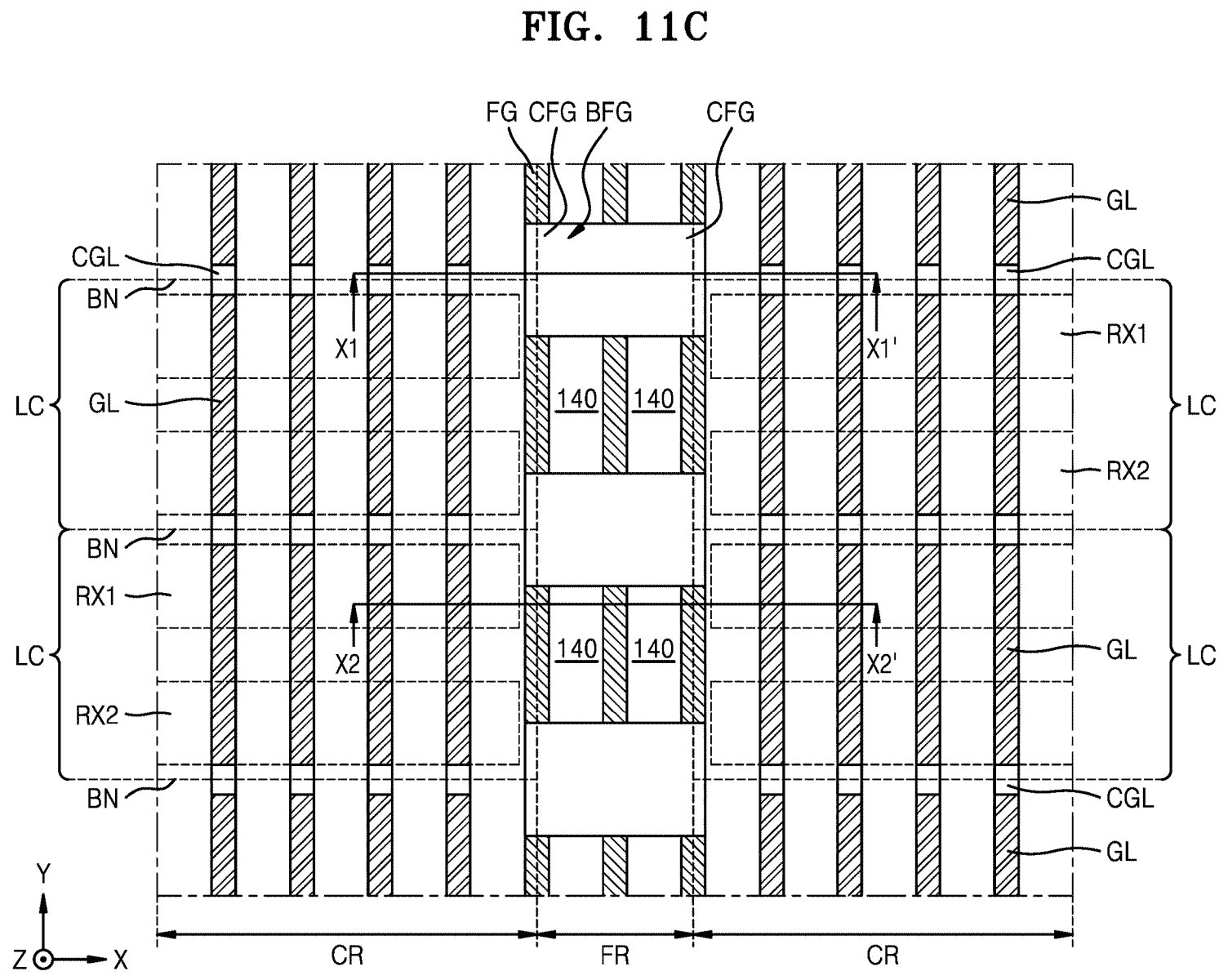

Referring to FIGS. 11A, 11B, and 11C, the mask pattern MP may be removed from the resultant structure of FIGS. 10A and 10B, and a plurality of dummy gate insulation lines FG may be formed to fill the plurality of dummy insulating spaces FGH. In embodiments, the plurality of dummy gate insulation lines FG may include a silicon nitride film, without being limited thereto.

After the plurality of dummy gate insulation lines FG are formed, the insulating spacers 118, the insulation liner 142, and the inter-gate insulating film 144, which remain between the plurality of dummy gate insulation lines FG in the inter-cell isolation region FR, may constitute a source/drain via contact 140.

Figure 12A:
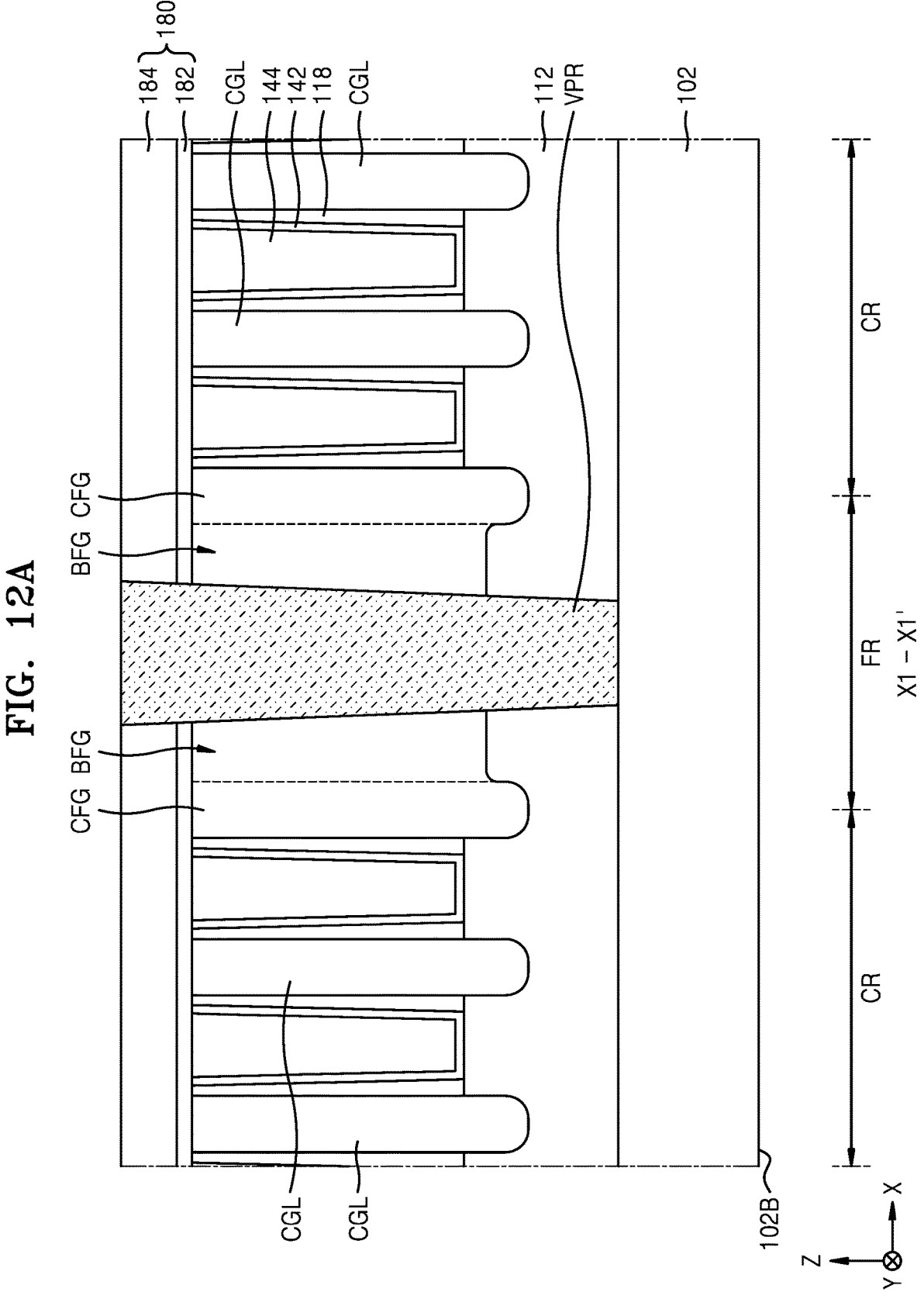
Figure 12B:
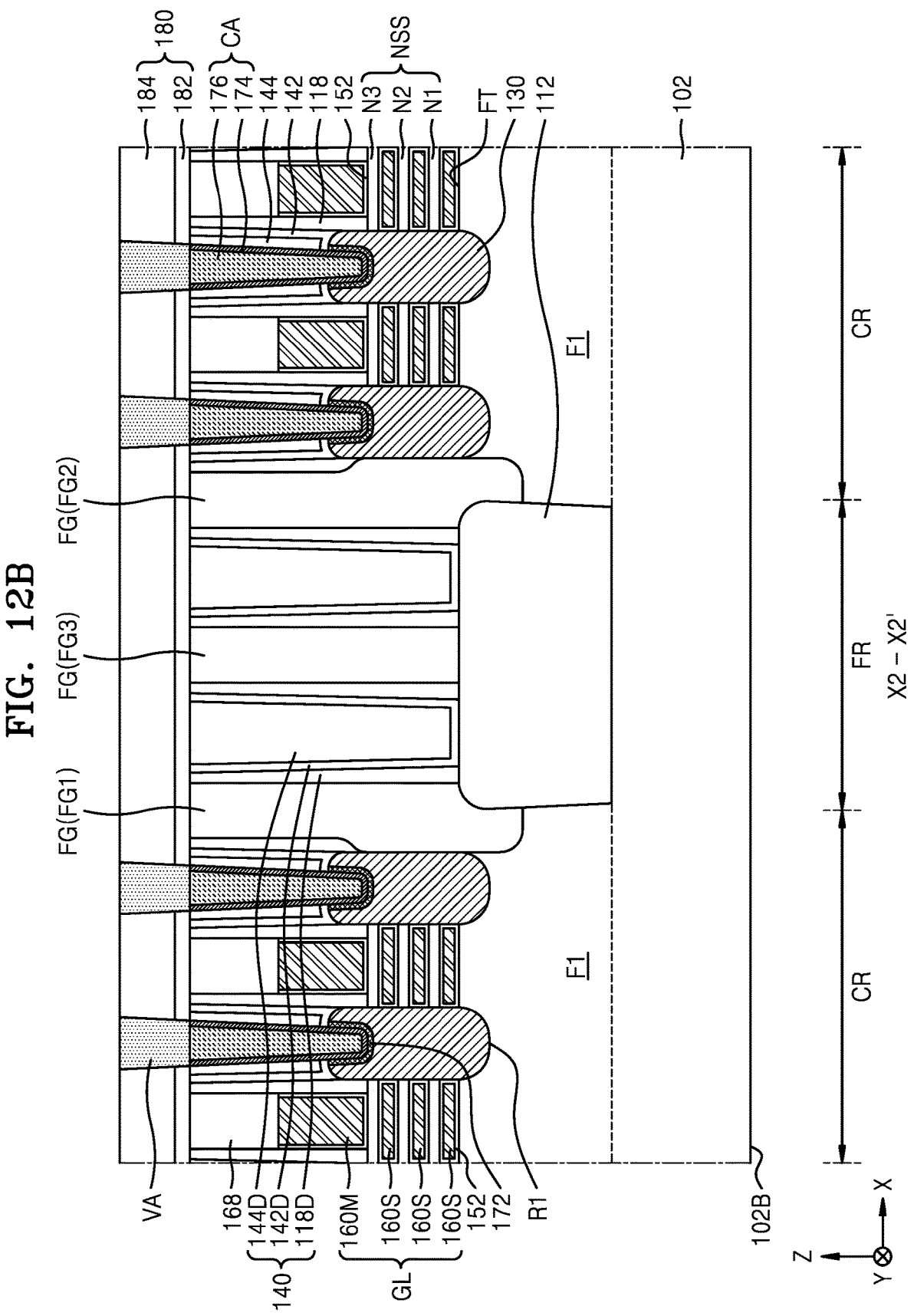

Referring to FIGS. 12A and 12B, in the resultant structure of FIGS. 11A, 11B, and 11C, in the plurality of cell regions CR, a source/drain contact hole exposing the source/drain region 130 may be formed to pass through the insulation liner 142 and the inter-gate insulating film 144 in a vertical direction (Z direction). Thereafter, a partial region of the source/drain region 130 may be removed by using an anisotropic etching process through the source/drain contact hole, and thus, the source/drain contact hole may extend longer toward the substrate 102. Thereafter, a metal silicide film 172 may be formed on the source/drain region 130, which is exposed at a bottom side of the source/drain contact hole. In embodiments, the formation of the metal silicide film 172 may include forming a metal liner (not shown) to conformally cover an exposed surface of the source/drain region 130 and annealing the meal liner to induce a reaction of the source/drain region 130 with a metal included in the metal liner. After the metal silicide film 172 is formed, the remaining portion of the metal liner may be removed. A portion of the source/drain region 130 may be consumed during the formation of the metal silicide film 172. In embodiments, when the metal silicide film 172 includes titanium silicide film, the metal liner may include a titanium (Ti) film. Thereafter, a source/drain contact CA including a conductive barrier film 174 and a contact plug 176 may be formed on the metal silicide film 172.

Afterwards, in the plurality of cell regions CR and the inter-cell isolation region FR, an etch stop film 182 and an upper insulating film 184 may be sequentially formed on exposed surfaces on the substrate 102 to form an upper insulation structure 180.

Afterwards, a plurality of source/drain via contacts VA and a gate contact (refer to gate contact CB in FIG. 3C) may be formed in the plurality of cell regions CR. The plurality of source/drain via contacts VA may pass through the upper insulation structure 180 in the vertical direction (Z direction) and be connected to the plurality of source/drain contacts CA. The gate contact CB may pass through the upper insulation structure 180 and the capping insulating pattern 168 in the vertical direction (Z direction) and be connected to the gate line GL. In addition, in the inter-cell isolation region FR, a plurality of via power rails VPR may be formed to pass through the upper insulation structure 180, the plurality of bridge insulating patterns BFG, and the device isolation film 112 in a vertical direction. The order of formation of the source/drain via contact VA, the gate contact CB, and the via power rail VPR is not specifically limited.

Thereafter, an interlayer insulating film 192 may be formed to cover the upper insulation structure 180 and the via power rail VPR. A plurality of upper wiring layers M1 may be formed to pass through the interlayer insulating film 192 and be connected to each of the source/drain via contact VA, the gate contact CB, and the via power rail VPR.

Subsequently, as shown in FIGS. 3A, 3B, and 3C, a portion of the substrate 102 may be removed from the back side surface 102B of the substrate 102 to reduce a thickness of the substrate 102 in the vertical direction (Z direction). To reduce the thickness of the substrate 102 in the vertical direction (Z direction), at least one selected from a mechanical grinding process, a chemical mechanical polishing (CMP) process, a wet etching process, and a combination thereof may be used. As a result, the back side surface 102B of the substrate 102, which is exposed, may become closer to the device isolation film 112 than before.

Thereafter, as shown in FIG. 3A, insulating spacers IL may be formed to pass through the substrate 102 in the vertical direction (Z direction). Also, a back side power rail MW may be formed to pass through the substrate 102 in the vertical direction (Z direction) and be in contact with one end of the via power rail VPR. Subsequently, as shown in FIGS. 3A, 3B, and 3C, a back side insulating film 109 may be formed to cover the back side surface 102B and the back side power rail MW of the substrate 102. A power line PL may be formed to pass through the back side insulating film 109 in the vertical direction (Z direction) and be in contact with the back side power rail MW. Thus, the IC device 100 may be manufactured.

Figure 13:
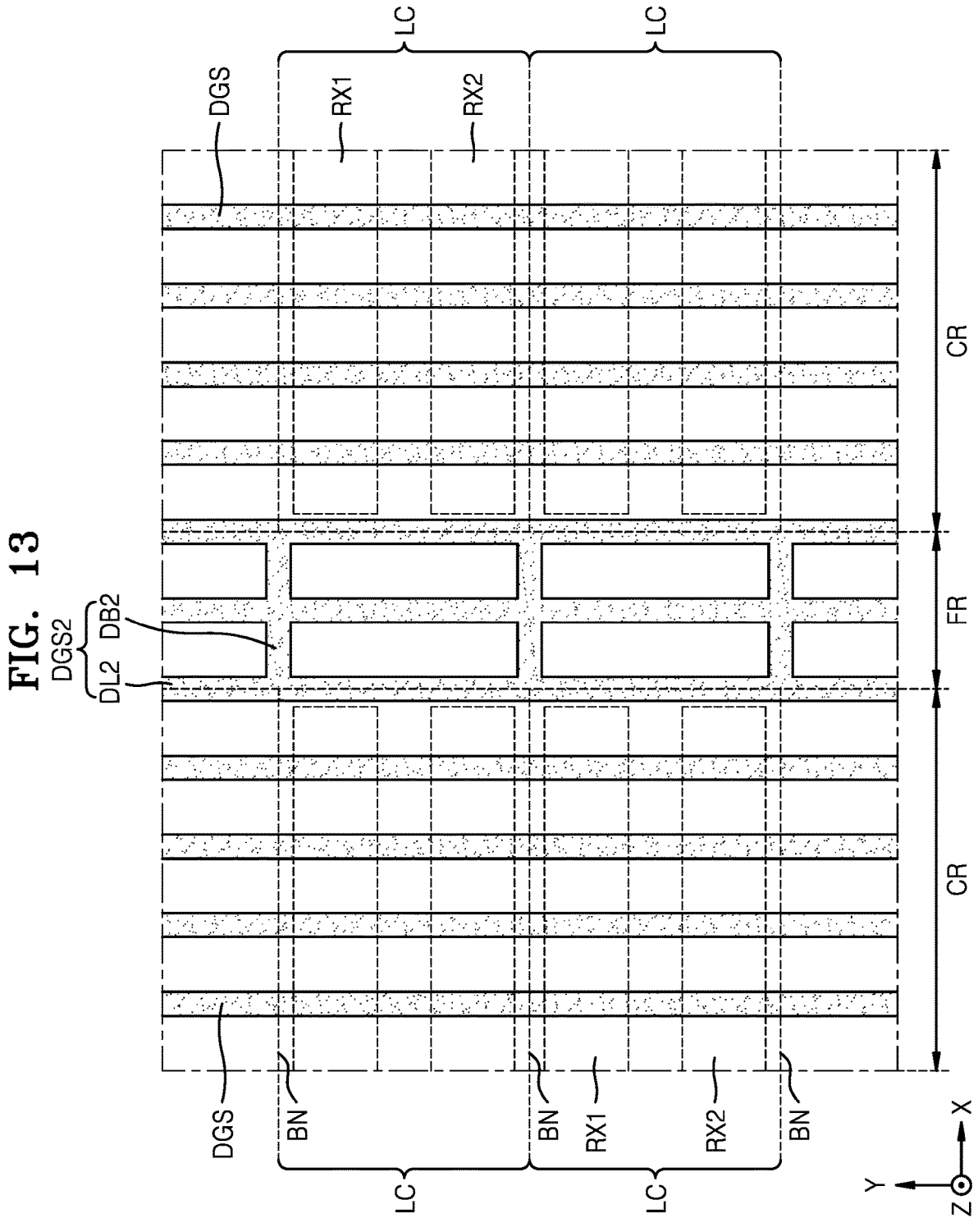
FIG. 13 is a plan view of a method of manufacturing an IC device, according to example embodiments.

FIG. 13 is a plan view of a method of manufacturing an IC device, according to example embodiments. Another example method of manufacturing the IC device 100 described with reference to FIGS. 1 to 3C is described with reference to FIG. 13. In FIG. 13, the same reference numerals are used to denote the same elements as in FIGS. 4A to 12B, and detailed descriptions thereof are not repeated.

Referring to FIG. 13, to manufacture the IC device 100, substantially the same processes as those described with reference to FIGS. 4A to 12B may be performed. However, in the process described with reference to FIGS. 5A, 5B, and 5C, a plurality of dummy gate structures DGS2 may be formed instead of the plurality of dummy gate structures DGS in an inter-cell isolation region FR.

The plurality of dummy gate structures DGS2 in the inter-cell isolation region FR may include a plurality of linear portions DL2 and a plurality of bridge portions DB2. The plurality of linear portions DL2 may extend lengthwise in a second lateral direction (Y direction). The plurality of bridge portions DB2 may be integrally connected to each of two linear portions DL2, which are adjacent to each other in the first lateral direction (X direction) from among the plurality of linear portions DL2, and extend from the two linear portions DL2 in the first lateral direction (X direction). Each of the plurality of bridge portions DB2 may be formed to be in an extension line of the cell boundary BN, which is in the first lateral direction (X direction), in each of a pair of cells LC that are adjacent to each other in the second lateral direction (Y direction) in the plurality of cell regions CR. For example, each of the plurality of bridge portions DB2 may overlap a line extending from the cell boundary BN of the cell LC in the first lateral direction (X direction), in each of a pair of cells LC that are adjacent to each other in the second lateral direction (Y direction). A portion of the inter-cell isolation region FR, which corresponds to the extension line of the cell boundary BN, may be covered by the plurality of bridge portions DB2. The portion of the inter-cell isolation region FR, which corresponds to the extension line of the cell boundary BN may have no portion that is not covered by the bridge portion DB2. From among the plurality of bridge portions DB2, two bridge portions DB2, which are most adjacent to each other in the first lateral direction (X direction), may be in a straight line along the extension line of the cell boundary BN. For example, the two bridge portions DB2 that are most adjacent to each other in the first lateral direction (X direction) may overlap a line extending from the cell boundary BN.

In embodiments, a width of each of the plurality of bridge portions DB2 may be substantially equal to a width of each of the plurality of linear portions DL2. In other embodiments, the width of each of the plurality of bridge portions DB2 may be less or greater than the width of each of the plurality of linear portions DL2. Details of the plurality of dummy gate structures DGS2 may be substantially the same as those of the plurality of dummy gate structures DGS, which have been described with reference to FIGS. 5A, 5B, and 5C.

Thereafter, the processes described with reference to FIGS. 6A to 12B may be performed on the resultant structure of FIG. 13, and thus, the IC device 100 shown in FIGS. 1 to 3C may be manufactured.

Similarly to that shown in FIG. 5B, a nanosheet stack NSS may be under each of the plurality of dummy gate structures DGS in the plurality of cell regions CR. Accordingly, each of the plurality of dummy gate structures DGS may be physically supported by the nanosheet stack NSS. Thus, there may be no anxiety for causing structural defects, such as the bending or leaning of the plurality of dummy gate structures DGS in an undesired direction due to stress from surrounding environments in a subsequent process.

Although the nanosheet stack NSS is not present under each of the plurality of dummy gate structures DGS2 in the inter-cell isolation region FR, the plurality of dummy gate structures DGS2 in the inter-cell isolation region FR may respectively include a plurality of linear portions DL2 and the plurality of bridge portions DB2 as shown in FIG. 13. Accordingly, the plurality of linear portions DL2 included in the plurality of dummy gate structures DGS2 may be supported by the plurality of bridge portions DB2. Thus, there may be no anxiety for causing structure defects, such as the bending or leaning of the plurality of linear portions DL2 in an undesired direction due to stress from surrounding environments in a subsequent process. Therefore, the plurality of dummy gate structures DGS in the plurality of cell regions CR may be prevented from being adversely affected due to structural defects, such as the bending or leaning of the plurality of dummy gate structures DGS2. As a result, in a subsequent process, the plurality of gate lines GL obtained from the plurality of dummy gate structures DGS arranged in the plurality of cell regions CR may be arranged at desired positions with high precision. Therefore, in the process of manufacturing the IC device 100, the occurrence of defects, such as undesired short circuits or disconnection between the plurality of gate lines GL and conductive lines adjacent thereto, may be prevented.

Figure 14:
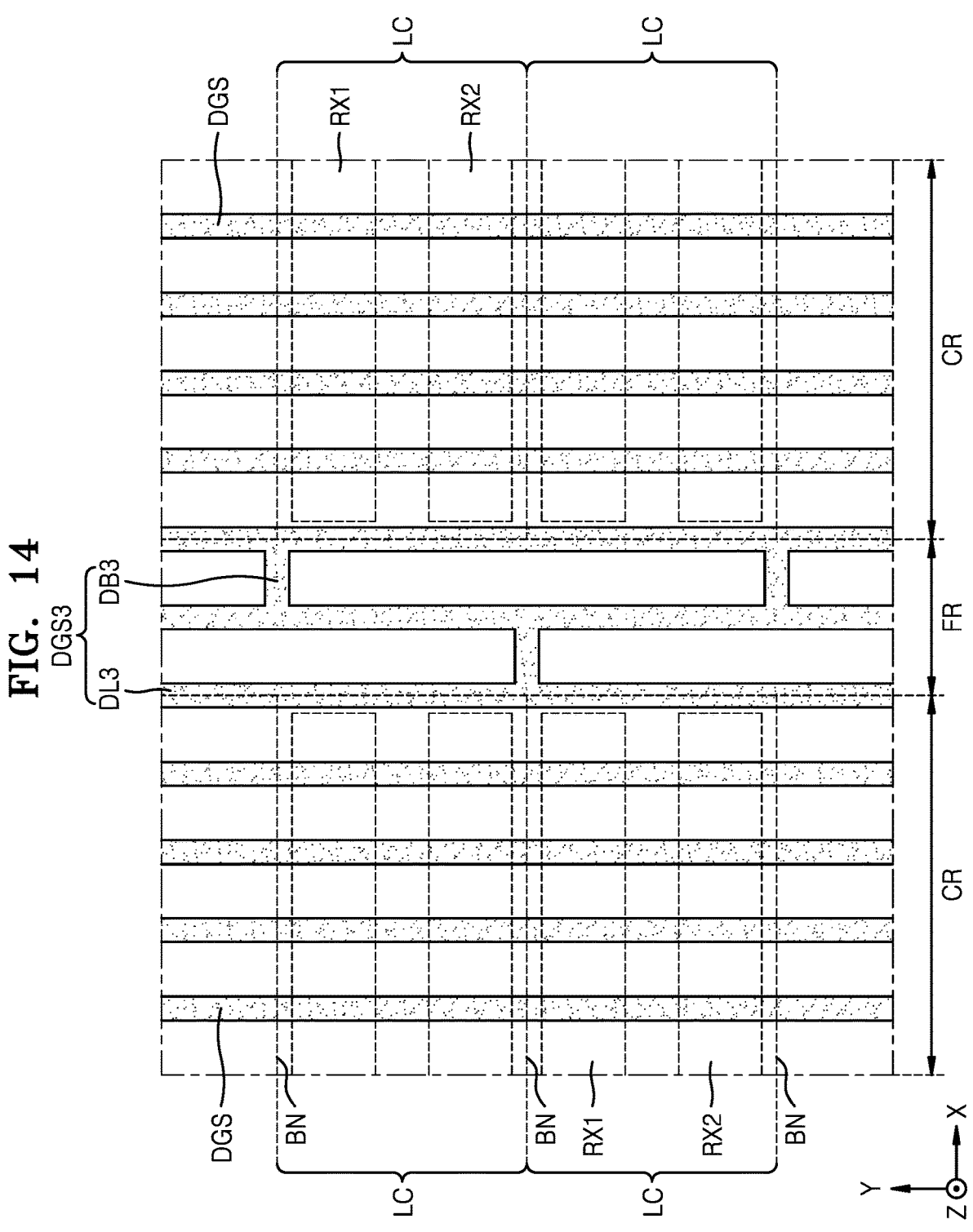
FIG. 14 is a plan view of a method of manufacturing an IC device, according to example embodiments.

FIG. 14 is a plan view of a method of manufacturing an IC device, according to example embodiments. Still another example method of manufacturing the IC device 100 described with reference to FIGS. 1 to 3C is described with reference to FIG. 14. In FIG. 14, the same reference numerals are used to denote the same elements as in FIGS. 4A to 12B, and detailed descriptions thereof are not repeated.

Referring to FIG. 14, to manufacture the IC device 100, substantially the same processes as those described with reference to FIGS. 4A to 12B may be performed. However, in the process described with reference to FIGS. 5A, 5B, and 5C, a plurality of dummy gate structures DGS3 may be formed instead of the plurality of dummy gate structures DGS in an inter-cell isolation region FR.

The plurality of dummy gate structures DGS3 in the inter-cell isolation region FR may include a plurality of linear portions DL3 and a plurality of bridge portions DB3. The plurality of linear portions DL3 may extend lengthwise in the second lateral direction (Y direction). The plurality of bridge portions DB3 may be integrally connected to each of two linear portions DL3, which are adjacent to each other in the first lateral direction (X direction) from among the plurality of linear portions DL3, and extend from the two linear portions DL3 in the first lateral direction (X direction). Each of the plurality of bridge portions DB3 may be formed to be in an extension line of the cell boundary BN, which is in the first lateral direction (X direction), in each of a pair of cells LC that are adjacent to each other in the second lateral direction (Y direction) in the plurality of cell regions CR. A portion of the inter-cell isolation region FR, which corresponds to the extension line of the cell boundary BN, may include a portion covered by the bridge portion DB3 and a portion not covered by the bridge portion DB3. Accordingly, any one of the plurality of bridge portions DB3 and another one of the plurality of bridge portions DB3 may not be in a straight line in the first lateral direction (X direction). The plurality of bridge portions DB3 may be in a zigzag manner in the second lateral direction (Y direction).

In embodiments, a width of each of the plurality of bridge portions DB3 may be substantially equal to a width of each of the plurality of linear portions DL3. In other embodiments, the width of each of the plurality of bridge portions DB3 may be less or greater than the width of each of the plurality of linear portions DL3. Details of the plurality of dummy gate structures DGS3 may be substantially the same as those of the plurality of dummy gate structures DGS, which are described with reference to FIGS. 5A, 5B, and 5C.

Thereafter, the processes described with reference to FIGS. 6A to 12B may be performed on the resultant structure of FIG. 13, and thus, the IC device 100 shown in FIGS. 1 to 3C may be performed.

A nanosheet stack NSS may be under each of the plurality of dummy gate structures DGS in the plurality of cell regions CR. Accordingly, each of the plurality of dummy gate structures DGS may be physically supported by the nanosheet stack NSS. Thus, there may be no anxiety for causing structural defects, such as the bending or leaning of the plurality of dummy gate structures DGS in an undesired direction due to stress from surrounding environments in a subsequent process.

Although the nanosheet stack NSS is not present under each of the plurality of dummy gate structures DGS3 in the inter-cell isolation region FR, the plurality of dummy gate structures DGS3 in the inter-cell isolation region FR may respectively include a plurality of linear portions DL3 and the plurality of bridge portions DB3 as shown in FIG. 14. Accordingly, the plurality of linear portions DL3 included in the plurality of dummy gate structures DGS3 may be supported by the plurality of bridge portions DB3. Thus, there may be no anxiety for causing structure defects, such as the bending or leaning of the plurality of linear portions DL3 in an undesired direction due to stress from surrounding environments in a subsequent process. Therefore, the plurality of dummy gate structures DGS in the plurality of cell regions CR may be prevented from being adversely affected due to structural defects, such as the bending or leaning of the plurality of dummy gate structures DGS3. As a result, in a subsequent process, a plurality of gate lines GL obtained from the plurality of dummy gate structures DGS arranged in the plurality of cell regions CR may be arranged at desired positions with high precision. Therefore, in the process of manufacturing the IC device 100, the occurrence of defects, such as undesired short circuits or disconnection between the plurality of gate lines GL and conductive lines adjacent thereto, may be prevented.

Although the methods of manufacturing the IC device 100 described with reference to FIGS. 1 to 3C have been described with reference to FIGS. 4A to 14, it will be understood that the IC devices 100 shown in FIGS. 1 to 3C and IC devices having various other structures may be manufactured by applying various modifications and changes to the processes described with reference to FIGS. 4A to 14 within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a first cell and a second cell apart from each other in a first lateral direction on a substrate, the first cell and the second cell each comprising a plurality of gate lines;
   an inter-cell isolation region between the first cell and the second cell, the inter-cell isolation region extending lengthwise in a second lateral direction, wherein the second lateral direction is perpendicular to the first lateral direction;
   a power line extending lengthwise in the first lateral direction on the substrate, the power line comprising portions overlapping a cell boundary of each of the first cell and the second cell in a vertical direction and a portion overlapping the inter-cell isolation region in the vertical direction;
   a plurality of dummy gate insulation lines extending lengthwise in the second lateral direction in the inter-cell isolation region, the plurality of dummy gate insulation lines being arranged at a constant pitch in the first lateral direction together with the plurality of gate lines;
   a bridge insulating pattern in contact with an end portion of each of the plurality of dummy gate insulation lines in the inter-cell isolation region, the bridge insulating pattern overlapping the power line in the vertical direction; and
   a via power rail passing through the bridge insulating pattern in the vertical direction, the via power rail being connected to the power line.

2. The integrated circuit device of claim 1,
   wherein the substrate comprises a front side surface facing the plurality of gate lines and a back side surface that is opposite to the front side surface, and
   wherein the power line is on the back side surface of the substrate.

3. The integrated circuit device of claim 1, wherein a length of each of the plurality of dummy gate insulation lines is less than a length of at least one of the plurality of gate lines in the second lateral direction.

4. The integrated circuit device of claim 1, wherein the plurality of dummy gate insulation lines comprises:

a first dummy gate insulation line overlapping a first cell boundary of the first cell in the vertical direction;

a second dummy gate insulation line overlapping a second boundary of the second cell in the vertical direction; and a third dummy gate insulation line between the first dummy gate insulation line and the second dummy gate insulation line, wherein a distance between the first dummy gate insulation line and the third dummy gate insulation line is equal to a distance between the second dummy gate insulation line and the third dummy gate insulation line in the first lateral direction.

5. The integrated circuit device of claim 1, further comprising:

an inter-gate insulating structure between every two adjacent ones of the plurality of gate lines in each of the first cell and the second cell; and a dummy inter-gate insulating structure between every two adjacent ones of the plurality of dummy gate insulation lines in the inter-cell isolation region, wherein the inter-gate insulation structure and the dummy inter-gate insulation structure comprise the same material as each other, and wherein the dummy inter-gate insulation structure is in contact with the bridge insulating pattern.

6. The integrated circuit device of claim 1, wherein the via power rail is in an extension line of a cell boundary of each of the first cell and the second cell in the first lateral direction.

7. The integrated circuit device of claim 1, wherein a vertical level of a top surface of the via power rail, which is farthest from the substrate, is farther from the substrate than a vertical level of a top surface of the bridge insulating pattern, which is farthest from the substrate.

8. The integrated circuit device of claim 1, wherein each of the first cell and the second cell further comprises:

a fin-type active region protruding from the substrate in the vertical direction, the fin-type active region extending lengthwise in the first lateral direction;

a pair of source/drain regions on the fin-type active region, on both sides of a selected one of the plurality of gate lines; and at least one nanosheet on the fin-type active region, the at least one nanosheet being in contact with each of the pair of source/drain regions and surrounded by the selected one gate line.

9. The integrated circuit device of claim 1, wherein each of the first cell and the second cell further comprises:

a fin-type active region protruding from the substrate in the vertical direction, the fin-type active region extending lengthwise in the first lateral direction;

a source/drain region on the fin-type active region;

a source/drain contact spaced apart from the via power rail, the source/drain contact being connected to the source/drain region;

a source/drain via contact spaced apart from the via power rail, the source/drain via contact being connected to the source/drain contact; and a plurality of upper wiring layers on the source/drain via contact, wherein the via power rail is connected to the source/drain via contact through at least one upper wiring layer selected from the plurality of upper wiring layers.

10. The integrated circuit device of claim 1, wherein each of the first cell and the second cell further comprises:

a fin-type active region protruding from the substrate in the vertical direction, the fin-type active region extending lengthwise in the first lateral direction; and a device isolation film covering sidewalls of the fin-type active region, wherein the device isolation film comprises a portion between the substrate and the bridge insulating pattern, in the inter-cell isolation region, and wherein the via power rail passes through the device isolation film in the vertical direction in the inter-cell isolation region.

11. The integrated circuit device of claim 1, wherein a width of the bridge insulating pattern is greater than a width of each of the plurality of dummy gate insulation lines in the first lateral direction.

12. An integrated circuit device comprising:

a first cell region and a second cell region spaced apart from each other in a first lateral direction on a substrate, the first cell region and the second cell region each comprising a plurality of cells arranged in a line along a second lateral direction, wherein the second lateral direction is perpendicular to the first lateral direction;

an inter-cell isolation region extending lengthwise in the second lateral direction between the first cell region and the second cell region;

a plurality of power lines crossing the first cell region, the inter-cell isolation region, and the second cell region, in the first lateral direction on a back side surface of the substrate, the plurality of power lines being parallel to each other;

a plurality of dummy gate insulation lines on a front side surface of the substrate in the inter-cell isolation region, the plurality of dummy gate insulation lines intermittently extending in a straight line in the second lateral direction;

a plurality of bridge insulating patterns respectively in contact with end portions of the plurality of dummy gate insulation lines in the inter-cell isolation region, the plurality of bridge insulating patterns overlapping the plurality of power lines in a vertical direction; and a plurality of via power rails in the inter-cell isolation region, wherein each of the plurality of via power rails passes through a bridge insulating pattern of a selected one of the plurality of bridge insulating patterns in the vertical direction and is connected to a selected one of the plurality of power lines.

13. The integrated circuit device of claim 12, wherein the plurality of bridge insulating patterns are arranged in a straight line in the second lateral direction in the inter-cell isolation region.

14. The integrated circuit device of claim 12, wherein the plurality of via power rails are arranged in a straight line in the second lateral direction in the inter-cell isolation region.

15. The integrated circuit device of claim 12, wherein each of the plurality of power lines comprises a portion vertically overlapping a cell boundary of each of cells arranged in one row, which is selected from the plurality of cells and extends in the first lateral direction.

16. The integrated circuit device of claim 12, wherein each of the plurality of dummy gate insulation lines comprises a portion vertically overlapping a cell boundary of each of the plurality of cells included in any one of the first cell region and the second cell region.

17. The integrated circuit device of claim 12, wherein the plurality of dummy gate insulation lines are spaced apart from each of the first cell region and the second cell region, in the first lateral direction.

18. The integrated circuit device of claim 12, wherein each of the plurality of cells comprises:

a fin-type active region protruding from the front side surface of the substrate in the vertical direction, the fin-type active region extending lengthwise in the first lateral direction;

at least one nanosheet on the fin-type active region; and a gate line surrounding the at least one nanosheet and extending lengthwise in the second lateral direction, wherein each of the plurality of dummy gate insulation lines comprises a portion overlapping the fin-type active region in the vertical direction, wherein a length of each of the plurality of dummy gate insulation lines is less than a length of the gate line in the second lateral direction, and wherein a lowermost surface of each of the plurality of dummy gate insulation lines, which is closest to the substrate, is closer to the substrate than a fin top surface of the fin-type active region.

19. An integrated circuit device comprising:

a first cell region and a second cell region spaced apart from each other in a first lateral direction on a substrate, the first cell region and the second cell region each comprising a plurality of cells;

an inter-cell isolation region between the first cell region and the second cell region on the substrate, the inter-cell isolation region extending lengthwise in a second lateral direction, wherein the second lateral direction is perpendicular to the first lateral direction;

a plurality of gate lines extending lengthwise in the second lateral direction in each of the plurality of cells;

a plurality of dummy gate insulation lines extending lengthwise in the second lateral direction in the inter-cell isolation region, the plurality of dummy gate insulation lines arranged at a constant pitch in the first lateral direction together with the plurality of gate lines;

a plurality of power lines on a back side surface of the substrate, each power line comprising a portion vertically overlapping a cell boundary of each of cells arranged in one row extending in the first lateral direction, from among the plurality of cells, a portion vertically overlapping a cell boundary of cells arranged in another row, which extends in the first lateral direction and is adjacent to the one row, from among the plurality of cells, and a portion vertically overlapping the inter-cell isolation region;

a plurality of bridge insulating patterns in contact with end portions of at least two dummy gate insulation lines, which are selected from the plurality of dummy gate insulation lines and are adjacent to each other in the first lateral direction in the inter-cell isolation region, the plurality of bridge insulation patterns having a width greater than a width of the plurality of dummy gate insulation lines in the first lateral direction, and the plurality of bridge insulating patterns overlapping the plurality of power lines in the vertical direction; and a plurality of via power rails, each via power rail passing through a selected one of the plurality of bridge insulating patterns in a vertical direction in the inter-cell isolation region, each via power rail being connected to a selected one of the plurality of power lines, wherein a length of each of the plurality of dummy gate insulation lines is less than a length of at least one of the plurality of gate lines in the second lateral direction.

20. The integrated circuit device of claim 19, wherein the plurality of bridge insulating patterns are arranged in a straight line in the second lateral direction, and the plurality of via power rails are arranged in a line along a straight line in the second lateral direction.

\* \* \* \* \*